United States Patent
Sims et al.

(10) Patent No.: US 9,865,455 B1
(45) Date of Patent: Jan. 9, 2018

(54) NITRIDE FILM FORMED BY PLASMA-ENHANCED AND THERMAL ATOMIC LAYER DEPOSITION PROCESS

(71) Applicant: Lam Research Corporation, Fremont, CA (US)

(72) Inventors: James Samuel Sims, Tigard, OR (US); Kathryn Merced Kelchner, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/258,789

(22) Filed: Sep. 7, 2016

(51) Int. Cl.
*H01L 21/469* (2006.01)
*H01L 21/02* (2006.01)
*C23C 16/34* (2006.01)
*C23C 16/50* (2006.01)
*C23C 16/46* (2006.01)
*C23C 16/455* (2006.01)

(52) U.S. Cl.
CPC ...... *H01L 21/02274* (2013.01); *C23C 16/345* (2013.01); *C23C 16/45527* (2013.01); *C23C 16/46* (2013.01); *C23C 16/50* (2013.01); *H01L 21/0217* (2013.01); *H01L 21/0228* (2013.01)

(58) Field of Classification Search
CPC ........... H01L 21/02274; H01L 21/0228; H01L 21/0217; C23C 16/45527; C23C 16/50; C23C 16/46; C23C 6/345
USPC ...................................................... 438/5, 792
See application file for complete search history.

(56) References Cited

U.S. PATENT DOCUMENTS

| | | |
|---|---|---|
| 4,158,717 A | 6/1979 | Nelson |
| 4,500,563 A | 2/1985 | Ellenberger et al. |
| 4,575,921 A | 3/1986 | Bhagat |

(Continued)

FOREIGN PATENT DOCUMENTS

| | | |
|---|---|---|
| CN | 1732288 A | 2/2006 |
| CN | 101006195 A | 7/2007 |

(Continued)

OTHER PUBLICATIONS

U.S. Notice of Allowance dated Aug. 18, 2015 issued in U.S. Appl. No. 14/494,914.

(Continued)

*Primary Examiner* — Vu A Vu
(74) *Attorney, Agent, or Firm* — Weaver Austin Villeneuve & Sampson LLP

(57) ABSTRACT

Provided are methods and apparatuses for depositing a nitride film using one or more plasma-enhanced atomic layer deposition cycles and one or more thermal atomic layer deposition cycles in a single reactor. The number of thermal atomic layer deposition cycles can be equal to or greater than the number of plasma-enhanced atomic layer deposition cycles. Incorporation of thermal atomic layer deposition cycles with plasma-enhanced atomic layer deposition cycles can allow for greater fine-tuning of properties of the nitride film. In some implementations, the nitride film is a silicon nitride film. The silicon nitride film can be fine-tuned to allow for a more silicon-rich film with a greater refractive index. In some implementations, the plasma-enhanced atomic layer deposition cycles and the thermal atomic layer deposition cycles can be maintained at the same wafer temperature.

20 Claims, 9 Drawing Sheets

(56) References Cited

U.S. PATENT DOCUMENTS

| | | | |
|---|---|---|---|
| 4,869,781 A | 9/1989 | Euen et al. |
| 5,091,332 A | 2/1992 | Bohr et al. |
| 5,230,929 A | 7/1993 | Caporiccio et al. |
| 5,314,724 A | 5/1994 | Tsukune et al. |
| 5,496,608 A | 3/1996 | Matsuda et al. |
| 5,670,432 A | 9/1997 | Tsai |
| 5,731,235 A | 3/1998 | Srinivasan et al. |
| 5,856,003 A | 1/1999 | Chiu |
| 5,976,990 A | 11/1999 | Mercaldi et al. |
| 6,039,834 A | 3/2000 | Tanaka et al. |
| 6,153,519 A | 11/2000 | Jain et al. |
| 6,197,701 B1 | 3/2001 | Shue et al. |
| 6,228,779 B1 | 5/2001 | Bloom et al. |
| 6,326,322 B1 | 12/2001 | Kim et al. |
| 6,380,056 B1 | 4/2002 | Shue et al. |
| 6,395,652 B2 | 5/2002 | Kim et al. |
| 6,416,822 B1 | 7/2002 | Chiang et al. |
| 6,428,859 B1 | 8/2002 | Chiang et al. |
| 6,518,167 B1 | 2/2003 | You et al. |
| 6,534,395 B2 | 3/2003 | Werkhoven et al. |
| 6,548,368 B1 | 4/2003 | Narwankar et al. |
| 6,632,478 B2 | 10/2003 | Gaillard et al. |
| 6,638,879 B2 | 10/2003 | Hsieh et al. |
| 6,645,574 B1 | 11/2003 | Lee et al. |
| 6,709,928 B1 | 3/2004 | Jenne et al. |
| 6,730,614 B1 | 5/2004 | Lim et al. |
| 6,794,284 B2 | 9/2004 | Vaartstra |
| 6,926,798 B2 | 8/2005 | Biberger et al. |
| 6,933,245 B2 | 8/2005 | Lee et al. |
| 6,967,159 B2 | 11/2005 | Vaartstra |
| 7,019,159 B2 | 3/2006 | Dussarrat et al. |
| 7,041,335 B2 | 5/2006 | Chung |
| 7,172,792 B2 | 2/2007 | Wang et al. |
| 7,297,641 B2 | 11/2007 | Todd et al. |
| 7,300,885 B2 | 11/2007 | Hasebe et al. |
| 7,351,668 B2 | 4/2008 | Chou et al. |
| 7,462,571 B2 | 12/2008 | Hasebe et al. |
| 7,465,669 B2 | 12/2008 | Iyer et al. |
| 7,507,676 B2 | 3/2009 | Chou et al. |
| 7,510,984 B2 | 3/2009 | Saito et al. |
| 7,514,366 B2 | 4/2009 | Trivedi et al. |
| 7,622,369 B1 | 11/2009 | Lee et al. |
| 7,629,267 B2 | 12/2009 | Wan et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,713,592 B2 | 5/2010 | Nguyen et al. |
| 7,758,920 B2 | 7/2010 | Hasebe et al. |
| 7,825,039 B2 | 11/2010 | Takahashi et al. |
| 7,910,497 B2 * | 3/2011 | Olsen ................ C23C 16/0272 257/E21.143 |
| 7,919,416 B2 | 4/2011 | Lee et al. |
| 7,939,455 B2 | 5/2011 | Clark |
| 7,964,241 B2 | 6/2011 | Hasebe et al. |
| 7,964,513 B2 | 6/2011 | Todd et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,084,088 B2 | 12/2011 | Huy et al. |
| 8,119,544 B2 | 2/2012 | Hasebe et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,298,628 B2 | 10/2012 | Yang et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,592,328 B2 | 11/2013 | Hausmann et al. |
| 8,669,185 B2 | 3/2014 | Onizawa et al. |
| 8,703,578 B2 | 4/2014 | Hoentschel et al. |
| 8,728,956 B2 | 5/2014 | LaVoie et al. |
| 8,753,984 B2 | 6/2014 | Murakami et al. |
| 8,791,034 B2 | 7/2014 | Shealy et al. |
| 8,936,977 B2 | 1/2015 | Hoentschel et al. |
| 8,975,704 B2 | 3/2015 | Hoentschel et al. |
| 9,023,737 B2 | 5/2015 | Beynet et al. |
| 9,070,555 B2 | 6/2015 | Hausmann et al. |
| 9,095,869 B2 * | 8/2015 | Kilpi .................... C23C 16/403 |
| 9,214,333 B1 | 12/2015 | Sims et al. |
| 9,502,238 B2 | 11/2016 | Danek et al. |
| 9,564,312 B2 | 2/2017 | Henri et al. |
| 9,589,790 B2 | 3/2017 | Henri et al. |
| 9,601,693 B1 | 3/2017 | Henri et al. |
| 2002/0001929 A1 | 1/2002 | Biberger et al. |
| 2003/0143841 A1 | 7/2003 | Yang et al. |
| 2004/0043570 A1 | 3/2004 | Fujisaki et al. |
| 2005/0025885 A1 | 2/2005 | McSwiney et al. |
| 2005/0042865 A1 | 2/2005 | Cabral et al. |
| 2005/0100670 A1 | 5/2005 | Dussarrat et al. |
| 2005/0109276 A1 | 5/2005 | Iyer et al. |
| 2005/0118837 A1 | 6/2005 | Todd et al. |
| 2005/0158983 A1 | 7/2005 | Hoshi et al. |
| 2005/0159017 A1 | 7/2005 | Kim et al. |
| 2005/0196977 A1 | 9/2005 | Saito et al. |
| 2005/0227017 A1 | 10/2005 | Senzaki et al. |
| 2005/0287309 A1 | 12/2005 | Veerasamy |
| 2005/0287775 A1 | 12/2005 | Hasebe et al. |
| 2006/0008656 A1 | 1/2006 | Veerasamy |
| 2006/0084283 A1 | 4/2006 | Paranjpe et al. |
| 2006/0088985 A1 | 4/2006 | Haverkort et al. |
| 2006/0199357 A1 | 9/2006 | Wan et al. |
| 2006/0286776 A1 | 12/2006 | Ranish et al. |
| 2007/0137572 A1 | 6/2007 | Matsuura et al. |
| 2007/0167028 A1 | 7/2007 | Chou et al. |
| 2007/0251444 A1 | 11/2007 | Gros et al. |
| 2008/0038936 A1 | 2/2008 | Todd et al. |
| 2008/0063791 A1 | 3/2008 | Hasebe et al. |
| 2008/0081470 A1 | 4/2008 | Clark |
| 2008/0119057 A1 | 5/2008 | Chua et al. |
| 2008/0124946 A1 | 5/2008 | Xiao et al. |
| 2008/0138996 A1 | 6/2008 | Nishizuka |
| 2008/0139003 A1 | 6/2008 | Pirzada et al. |
| 2008/0213479 A1 | 9/2008 | Chou et al. |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |
| 2008/0318443 A1 | 12/2008 | Kim et al. |
| 2009/0018668 A1 | 1/2009 | Galbraith |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0191722 A1 | 7/2009 | Hasebe et al. |
| 2010/0038727 A1 | 2/2010 | Chakravarthi et al. |
| 2010/0099271 A1 | 4/2010 | Hausmann et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0151681 A1 | 6/2010 | Knapp et al. |
| 2010/0221925 A1 | 9/2010 | Lee et al. |
| 2010/0304047 A1 | 12/2010 | Yang et al. |
| 2010/0304574 A1 | 12/2010 | Nodera et al. |
| 2010/0310791 A1 | 12/2010 | Shimazu et al. |
| 2011/0003477 A1 | 1/2011 | Park et al. |
| 2011/0014795 A1 | 1/2011 | Lee et al. |
| 2011/0086516 A1 | 4/2011 | Lee et al. |
| 2011/0151142 A1 | 6/2011 | Seamons et al. |
| 2011/0176967 A1 | 7/2011 | Okuda et al. |
| 2011/0256734 A1 | 10/2011 | Hausmann et al. |
| 2012/0009802 A1 | 1/2012 | LaVoie et al. |
| 2012/0009803 A1 | 1/2012 | Jung et al. |
| 2012/0028469 A1 | 2/2012 | Onizawa et al. |
| 2012/0058282 A1 | 3/2012 | Hong et al. |
| 2012/0104347 A1 | 5/2012 | Quick |
| 2012/0108079 A1 | 5/2012 | Mahajani |
| 2012/0164846 A1 | 6/2012 | Ha et al. |
| 2012/0177841 A1 | 7/2012 | Thompson |
| 2012/0213940 A1 | 8/2012 | Mallick |
| 2012/0282418 A1 | 11/2012 | Chou et al. |
| 2012/0315394 A1 | 12/2012 | Ito |
| 2013/0071580 A1 | 3/2013 | Weidman et al. |
| 2013/0115783 A1 | 5/2013 | Kim et al. |
| 2013/0189854 A1 | 7/2013 | Hausmann et al. |
| 2013/0252437 A1 | 9/2013 | Sano et al. |

(56) References Cited

U.S. PATENT DOCUMENTS

| | | |
|---|---|---|
| 2013/0344248 A1 | 12/2013 | Clark |
| 2014/0141625 A1 | 5/2014 | Fukazawa et al. |
| 2014/0141626 A1 | 5/2014 | Hausmann et al. |
| 2014/0193983 A1 | 7/2014 | LaVoie |
| 2014/0262038 A1 | 9/2014 | Wang et al. |
| 2014/0273477 A1 | 9/2014 | Niskanen et al. |
| 2014/0273528 A1 | 9/2014 | Niskanen et al. |
| 2014/0273531 A1* | 9/2014 | Niskanen .............. C23C 16/045 438/793 |
| 2014/0302686 A1 | 10/2014 | Pan et al. |
| 2015/0031218 A1 | 1/2015 | Karakawa |
| 2015/0243708 A1 | 8/2015 | Ravasio et al. |
| 2015/0259791 A1 | 9/2015 | Hausmann et al. |
| 2016/0046501 A1 | 2/2016 | Kverel et al. |
| 2016/0093484 A1 | 3/2016 | Marsh |
| 2016/0148800 A1 | 5/2016 | Henri et al. |
| 2016/0148806 A1 | 5/2016 | Henri et al. |
| 2016/0293398 A1 | 10/2016 | Danek et al. |
| 2017/0092857 A1 | 3/2017 | Hausmann et al. |
| 2017/0117134 A1 | 4/2017 | Henri et al. |

FOREIGN PATENT DOCUMENTS

| | | |
|---|---|---|
| CN | 101255548 A | 9/2008 |
| CN | 101378007 A | 3/2009 |
| EP | 0 277 766 | 8/1988 |
| EP | 2 278 046 A1 | 1/2011 |
| JP | 2005-210076 A | 8/2005 |
| JP | 2006-060091 | 3/2006 |
| JP | 2008-517479 | 5/2008 |
| JP | 2010-10497 | 1/2010 |
| JP | 2010-283388 A | 12/2010 |
| JP | 2013225655 A | 10/2013 |
| JP | 2014-532304 A | 12/2014 |
| KR | 10-2009-0080019 | 7/2009 |
| WO | WO 2006/018441 | 2/2006 |
| WO | WO 2006/026350 | 3/2006 |
| WO | WO 2011/130397 | 10/2011 |
| WO | WO 2013/043330 | 3/2013 |

OTHER PUBLICATIONS

U.S. Office Action dated Oct. 1, 2015 issued in U.S. Appl. No. 14/552,245.
U.S. Notice of Allowance dated Feb. 1, 2016 issued in U.S. Appl. No. 14/552,245.
U.S. Office Action dated May 24, 2016 issued in U.S. Appl. No. 14/552,245.
U.S. Notice of Allowance dated Oct. 26, 2016 issued in U.S. Appl. No. 14/552,245.
U.S. Office Action dated May 25, 2016 issued in U.S. Appl. No. 14/552,011.
U.S. Notice of Allowance dated Sep. 26, 2016 issued in U.S. Appl. No. 14/552,011.
U.S. Notice of Allowance dated Jul. 15, 2016 issued in U.S. Appl. No. 14/678,736.
U.S. Office Action dated Apr. 18, 2016 issued in U.S. Appl. No. 14/935,317.
U.S. Notice of Allowance dated Sep. 19, 2016 issued in U.S. Appl. No. 14/935,317.
U.S. Office Action dated Sep. 14, 2012 issued in U.S. Appl. No. 13/084,305.
U.S. Final Office Action dated Apr. 25, 2013 issued in U.S. Appl. No. 13/084,305.
U.S. Office Action dated Jun. 7, 2013 issued U.S. Appl. No. 13/414,619.
U.S. Notice of Allowance dated Jul. 26, 2013, issued U.S. Appl. No. 13/414,619.
U.S. Office Action dated Apr. 11, 2014 issued in U.S. Appl. No. 14/065,334.
U.S. Final Office Action dated Nov. 14, 2014 issued in U.S. Appl. No. 14/065,334.
U.S. Notice of Allowance dated Feb. 17, 2015 issued in U.S. Appl. No. 14/065,334.
U.S. Notice of Allowance dated Feb. 8, 2017 issued in U.S. Appl. No. 14/713,639.
PCT Invitation to Pay Additional Fees; Communication Re Partial International Search, dated Dec. 16, 2011, issued in PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
Chinese First Office Action dated May 19, 2016 issued in CN 201310021460.8.
Chinese Second Office Action dated Apr. 13, 2017 issued in CN 201310021460.8.
European Extended Search Report dated Apr. 14, 2014 issued in EP 13 152 046.2.
Japanese Office Action dated Jan. 10, 2017 issued in JP 2013-007612.
Korean Notice of Provisional Rejection dated Dec. 6, 2013 issued in KR 10-2012-0043797.
Korean Final Office Action dated Aug. 18, 2014 issued in KR 10-2012-0043797.
Korean Decision from the Patent Tribunal of the KIPO [description] dated May 26, 2015 issued in KR 10-2012-0043797.
Taiwan Examination Report dated Mar. 29, 2017 issued in TW 102102054.
Aboaf, J.A. (1969) "Some Properties of Vapor Deposited Silicon Nitride Films Obtained by the Reaction of SiBr4 and NH 3," Journal of the Electrochemical Society, 116(12):1736-1740.
Becker, F.S. and Rohl, S. (Nov. 1987) "Low Pressure Deposition of Doped SiO2 by Pyrolysis of Tetraethylorthosilicate (TEOS)," J. Electrochem. Soc.: Solid-State Science and Technology, 134(11):2923-2931.
Cecchi et al., (2007) "Ultra-thin conformal pore-sealing of low-k materials by plasma-assisted ALD," University of New Mexico, Albuquerque, NM, Sandia National Labs, Albuquerque, NM, 1 page.
King, Sean W., (Jul./Aug. 2011) "Plasma enhanced atomic layer deposition of SiNx:H and SiO2," J. Vac. Sci. Technol. A29(4):041501-1 through 041501-9 (9 pages).
Lin et al., (1998) "Silicon Nitride Films Deposited by Atmospheric Pressure Chemical Vapor Deposition," Materials Research Society Symposium Proceedings vol. 495, Chemical Aspects of Electronic Ceramics Processing, Symposium held Nov. 30-Dec. 4, 1997, Boston, Massachusetts, U.S.A., 8 pages.
Plasma Enhanced Atomic Layer Deposition (PEALD), Website: http://www.asm.com/index.php?option=com_content&task=view&id=19&Itemid=161 (2010), 1 page.
"PlasmaProTM NGP® 80 Range," Oxford Instruments (2010), 8 pages.

* cited by examiner

NITRIDE FILM FORMED BY PLASMA-ENHANCED AND THERMAL ATOMIC LAYER DEPOSITION PROCESS

BACKGROUND

The present disclosure relates generally to the deposition of a nitride film on a wafer, and more particularly to deposition of a nitride film on a wafer by mixing cycles of plasma-enhanced atomic layer deposition processes and thermal atomic layer deposition processes.

As device and features size continue to shrink in the semiconductor industry, and also as 3-D device structures become more prevalent in integrated circuit (IC) design, the capability of depositing thin conformal films (films of material having a uniform thickness relative to the shape of the underlying structure, even if non-planar) will continue to gain importance. Atomic layer deposition (ALD) is a film forming technique which is well-suited to the deposition of conformal films due to the fact that a single cycle of ALD only deposits a single thin layer of material, the thickness being limited by the amount of one or more precursor reactants which may adsorb onto the wafer surface (i.e., forming an adsorption-limited layer) prior to the film-forming chemical reaction itself. Multiple "ALD cycles" may then be used to build up a film of the desired thickness, and since each layer is thin and conformal, the resulting film substantially conforms to the shape of the underlying device structure.

Semiconductor device fabrication may involve deposition of nitride films. For example, silicon nitride thin films have unique physical, chemical, and mechanical properties and thus are used in a variety of applications. For example, silicon nitride films may be used in diffusion barriers, gate insulators, sidewall spacers, encapsulation layers, strained films in transistors, and the like. Due to the role of silicon nitride films in IC design, it is often desirable for silicon nitride films to have a low wet etch rate or a low dry etch rate. Yet, the formation of such etch-resistant silicon nitride films via ALD has been difficult to achieve within typical thermal budget constraints.

SUMMARY

This disclosure pertains to a method including applying a plurality of mixed mode atomic layer deposition (ALD) cycles on a wafer. Each mixed mode ALD cycle includes one or more plasma-enhanced atomic layer deposition (PEALD) cycles and one or more thermal atomic layer deposition (thermal ALD) cycles, each PEALD and each thermal ALD cycle converting a nitrogen-containing reactant into a nitride layer on the wafer.

In some implementations, applying the plurality of mixed mode ALD cycles includes applying the one or more PEALD cycles, where applying the one or more PEALD cycles includes: introducing a first dose of a silicon-containing precursor in a vapor phase to the wafer, exposing the wafer to a plasma of the nitrogen-containing reactant, and converting the nitrogen-containing reactant into a nitride layer on the wafer, where the nitride layer is a silicon nitride layer. In some implementations, applying the plurality of mixed mode ALD cycles includes applying the one or more thermal ALD cycles, where applying the one or more thermal ALD cycles includes: introducing a second dose of the silicon-containing precursor in a vapor phase to the wafer, exposing the wafer to the nitrogen-containing reactant at an elevated temperature, and converting the nitrogen-containing reactant into a nitride layer at the elevated temperature, where the nitride layer is a silicon nitride layer. In some implementations, the elevated temperature is at least equal to or greater than 500° C. In some implementations, the wafer is maintained at the elevated temperature during the exposure of the wafer to the plasma of the nitrogen-containing reactant. In some implementations a ratio of silicon to nitrogen concentration in the silicon nitride layer is between 1.2:1 and 1.8:1. In some implementations, the silicon nitride layer has a refractive index between about 2.0 and 2.5. In some implementations, a number of the one or more thermal ALD cycles is equal to or greater than a number of the one or more PEALD cycles in each mixed mode ALD cycle.

This disclosure also pertains to a method of manufacturing a nitride film. The method includes providing a wafer into a process chamber, applying one or more PEALD cycles to deposit one or more nitride layers on a wafer via plasma conversion of a nitrogen-containing reactant, applying, before or after the one or more PEALD cycles, one or more thermal ALD cycles to deposit one or more nitride layers on the wafer via thermal conversion of the nitrogen-containing reactant, and forming a nitride film from the one or more nitride layers.

In some implementations, a number of the thermal ALD cycles is equal to or greater than a number of the PEALD cycles. In some implementations, a temperature equal to or greater than 500° C. is maintained during application of the one or more PEALD cycles and application of the one or more thermal ALD cycles. In some implementations, a time of thermal conversion of the nitrogen-containing reactant is greater than a time of plasma conversion of the nitrogen-containing reactant. In some implementations, the nitride film is a silicon nitride film. In some implementations, the silicon nitride film has a refractive index between about 2.0 and about 2.5. In some implementations, a ratio of silicon to nitrogen concentration in the silicon nitride film is between 1.2:1 and 1.8:1.

These and other embodiments are described further below with reference to the figures.

DETAILED DESCRIPTION

Introduction

Figure 1:
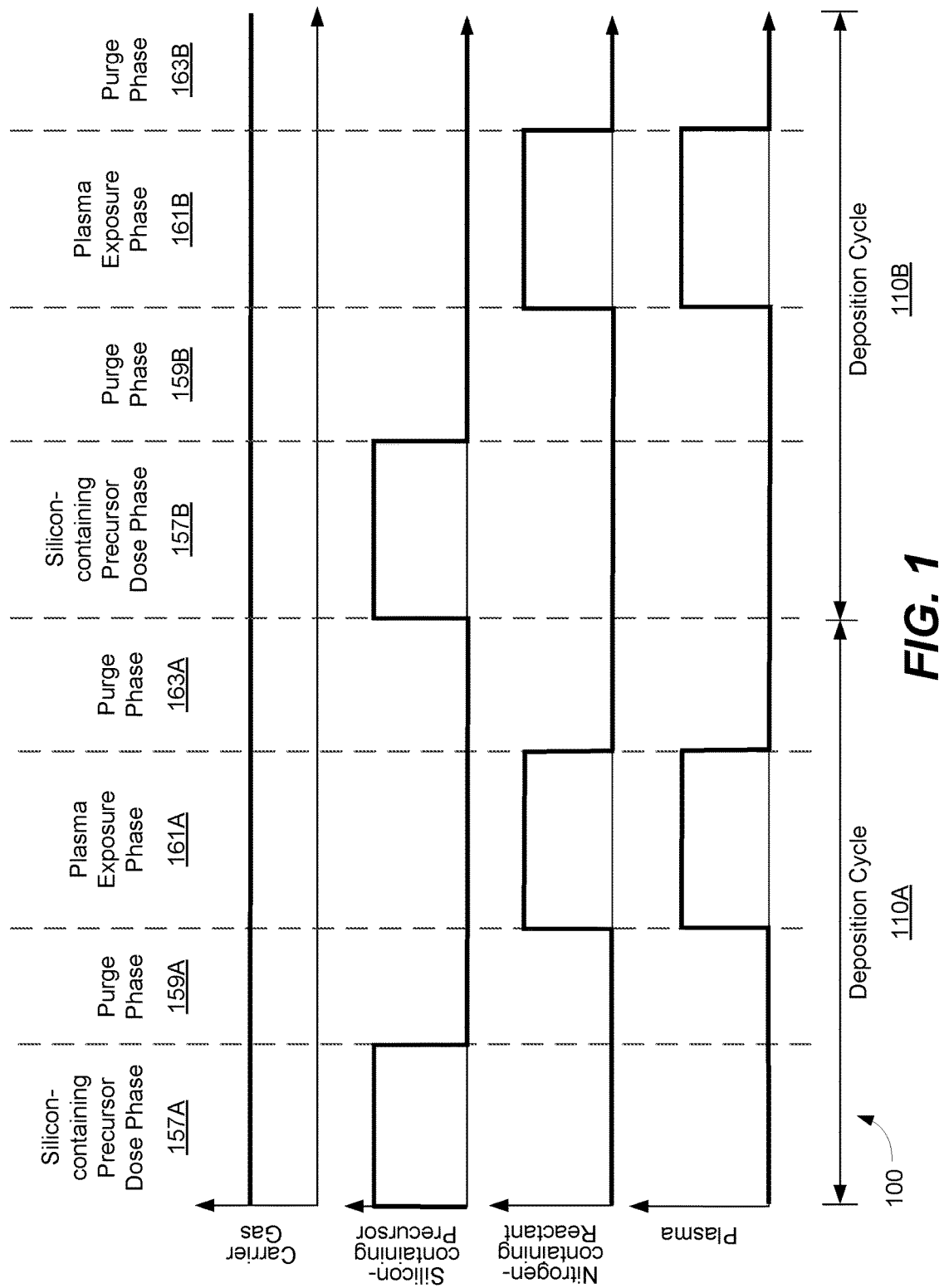
FIG. 1 illustrates an example timing sequence diagram showing multiple ALD cycles for depositing a silicon nitride film.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

ALD/PEALD

ALD is a technique that deposits thin layers of material using sequential self-limiting reactions. Typically, an ALD cycle includes operations to deliver and adsorb at least one reactant to the substrate surface, and then react the adsorbed reactant with one or more reactants to form the partial layer of film. As an example, a silicon nitride deposition cycle may include the following operations: (i) delivery/adsorption of a silicon-containing precursor, (ii) purging of silicon-containing precursor from the chamber, (iii) delivery of plasma of a nitrogen-containing reactant, and (iv) purging of plasma from the chamber. Other types of films may be deposited using pulses of various precursors and co-reactants.

Unlike a CVD technique, ALD processes use surface-mediated deposition reactions to deposit films on a layer-by-layer basis. In one example of an ALD process, a wafer surface that includes a population of surface active sites is exposed to a gas phase distribution of a first precursor, such as a silicon-containing precursor, in a dose provided to a chamber housing a wafer. Molecules of this first precursor are adsorbed onto the wafer surface, including chemisorbed species and/or physisorbed molecules of the first precursor. It should be understood that when the compound is adsorbed onto the wafer surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of first precursor remaining in gas phase so that mostly or only the adsorbed species remain. In some implementations, the chamber may not be fully evacuated. For example, the chamber may be evacuated such that the partial pressure of the first precursor in gas phase is sufficiently low to mitigate a reaction. A second reactant, such as a nitrogen-containing reactant, is introduced to the chamber so that some of these molecules react with the first precursor adsorbed on the surface. In some processes, the second precursor reacts immediately with the adsorbed first precursor. In other implementations, the second reactant reacts only after a source of activation is applied temporally. The chamber may then be evacuated again to remove unbound second reactant molecules. As described above, in some implementations the chamber may not be completely evacuated. Additional ALD cycles may be used to build film thickness.

In some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in their entireties.

FIG. 1 illustrates an example timing sequence diagram showing multiple ALD cycles for depositing a silicon nitride film. FIG. 1 shows phases in a typical ALD process 100, for various process parameters, such as carrier gas or purge gas flow, plasma, silicon-containing precursor flow, and nitrogen-containing reactant flow. Each of the ALD cycles in FIG. 1 may represent a PEALD cycle. The lines indicate when the flow is turned on and off, or when plasma is turned on and off. Example process parameters include, but are not limited to, flow rates for inert and reactant species, plasma power and frequency, wafer temperature, and process chamber pressure.

Any suitable number of deposition cycles may be included in an ALD process to deposit a desired film thickness of silicon nitride. The timing sequence in FIG. 1 depicts various operations of FIG. 1 in two deposition cycles, 110A and 110B. For example, during deposition cycle 110A, the wafer is exposed to a silicon-containing precursor during a dose phase 157A, and during deposition cycle 110B, the wafer is exposed to a silicon-containing precursor during a dose phase 157B. In some implementations, the silicon-containing precursor is a silane, such as a halogenated silane. During dose phases 157A and 157B, plasma is turned off, no nitrogen-containing reactant is flowed to the wafer, and a carrier gas, such as argon, continues to flow. In some implementations, the wafer may be exposed to the silicon-containing precursor for a time between about 0.1 seconds and about 60 seconds, or between about 0.2 seconds and about 6 seconds, depending on the flow rate and the wafer surface area.

In some implementations, the silicon-containing precursor adsorbs onto the substrate surface in a self-limiting manner such that once active sites are occupied by the silicon-containing precursor, little or no additional silicon-containing precursor will be adsorbed on the wafer surface. For example, silicon-containing precursors may be adsorbed onto at least 60% of the wafer surface. When the silicon-containing precursor adsorbs onto active sites on the surface of the wafer, a thin layer of the silicon-containing precursor forms on the surface. In various implementations, this layer may be less than a monolayer, and may have a thickness between about 0.1 Å and about 0.5 Å. Unlike a CVD or CVD-like process, the silicon-containing precursor does not decompose to form a silicon layer.

In purge phases 159A and 159B, a process chamber is optionally purged to remove excess silicon-containing precursor in the vapor phase that did not adsorb onto the surface of the wafer. Purging may involve a sweep gas, which may be a carrier gas used in other operations or a different gas. In some implementations, purging may involve evacuating the process chamber. During purge phases 159A and 159B, silicon-containing precursor flow is turned off, no plasma is ignited, and no nitrogen-containing reactant is supplied to the process chamber. The carrier gas, such as argon, continues to flow to purge any excess silicon-containing precursor from the process chamber. In some implementations, purge phases 159A and 159B may each include one or more evacuation subphases for evacuating the process chamber. Alternatively, it will be appreciated that each purge phase 159A and 159B may be omitted in some implementations. Each purge phase 159A and 159B may have any suitable duration, such as between about 0 seconds and about 60 seconds, or about 0.01 seconds. In some implementations, increasing a flow rate of one or more sweep gases may decrease the duration of each purge phase 159A and 159B. For example, a purge gas flow rate may be adjusted according to various reactant thermodynamic characteristics and/or geometric characteristics of the process chamber and/or process chamber plumbing for modifying the duration of each purge phase 159A and 159B. In one non-limiting example, the duration of a sweep phase may be adjusted by modulating sweep gas flow rate. This may reduce deposition cycle time, which may improve wafer throughput. After a purge, the silicon-containing precursors remain adsorbed onto the wafer surface.

A plasma may be ignited during plasma exposure phases 161A and 161B. For example, the wafer may be exposed to a nitrogen plasma during plasma exposure phases 161A and 161B. Accordingly, flow of nitrogen-containing reactant and plasma are both turned on during the plasma exposure phases 161A and 161B. In some implementations, flow of nitrogen-containing reactant may be turned on prior to turning on the plasma. Flow of silicon-containing precursor is turned off during plasma exposure phases 161A and 161B, and inert gas continues to flow. The wafer may be exposed to the plasma of the nitrogen-containing reactant for a duration between about 0.1 seconds and about 60 seconds, or between about 0.1 seconds and about 6 seconds. In some implementations, plasma exposure phases 161A and 161B may have a duration that exceeds a time for plasma to interact with all precursors adsorbed on the wafer surface, forming a continuous film atop the wafer surface.

In various implementations, the plasma is an in-situ plasma, such that the plasma is formed directly above the wafer surface in the process chamber. For example, plasmas for ALD processes may be generated by applying a radio frequency (RF) field to a gas using two capacitively-coupled plates. Ions, radicals, and other active species of the gas may form that participate in the deposition process. It will be appreciated that the RF field may be coupled via any suitable electrodes. Non-limiting examples of electrodes include process gas distribution showerheads and wafer support pedestals. It will be appreciated that plasmas for ALD processes may be formed by one or more suitable methods other than capacitive coupling of an RF field to a gas. In some implementations, the plasma is a remote plasma, such that nitrogen-containing reactant is ignited in a remote plasma generator upstream of the process chamber, then delivered to the process chamber where the wafer is housed. In some implementations, other types of plasma may be used, such as inductively-coupled plasmas instead of capacitively-coupled plasmas.

During plasma exposure phases 161A and 161B, an RF field is provided to activate the nitrogen-containing reactant into ions and radicals, which react with the adsorbed layer of the silicon-containing precursor. Without being bound by a particular theory, higher frequency plasmas may generate more radicals than ions, which can improve deposition of silicon nitride due to higher reactivity between the radicals and the silicon-containing precursor. In various implementations, a high frequency plasma is used having a frequency of at least about 13.56 MHz, or at least about 27 MHz, or at least about 40 MHz, or at least about 60 MHz. Once the nitrogen-containing reactant is activated to form plasma, the radicals and ions of the nitrogen-containing reactant react with the silicon-containing precursor adsorbed on the surface of the wafer, thereby forming a thin film of silicon nitride.

Next, the plasma is extinguished and the process chamber is purged during purge phases 163A and 163B. Silicon-containing precursor flow is turned off, no plasma is ignited, and no nitrogen-containing reactant is supplied to the process chamber. The purge may be performed by flowing the carrier gas or any other inert gas.

Performing operations 157A, 159A, 161A, and 163A may constitute a cycle, such as deposition cycle 110A, which can also be referred to as a silicon dose half-cycle. Performing operations 157B, 159B, 161B, and 163B may constitute another cycle, such as deposition cycle 110B, which can also be referred to as a nitride conversion half-cycle. Two half-cycles 110A and 110B added together can make a whole cycle. Depending on the dose time and the exposure times of the operations, each whole cycle (or two half-cycles) may deposit a silicon nitride film layer having a thickness between about 0.05 Å and about 2 Å. Cycles may be repeated until a desired film thickness of silicon nitride is achieved.

3D memory structures, such as vertical NAND flash memory structures, may have features with relatively high aspect ratios. The vertical configuration with relatively high aspect ratios permits the 3D memory structures to be formed at a significantly greater density. One or more layers of silicon nitride may be deposited as charge trap layers in 3D memory structures. The charge trap layer in a 3D memory structure may be capable of "trapping" charges when a voltage is applied, and may influence the program and erase steps of the 3D memory structure. Thus, the charge trap layer may be active in controlling the programming of the 3D memory structure.

In some instances, the charge trap layer is a silicon nitride film. The silicon nitride film can have the chemical formula $Si_xN_yH_z$, where stoichiometry control of $Si_xN_yH_z$ can be critical in tuning the write erase properties of the 3D memory structure. By controlling stoichiometry, defect levels in the band gap can be tuned in order to optimize the charge trapping capabilities of the film. One measurement proxy for $Si_xN_yH_z$ stoichiometry can be the refractive index.

In addition, the silicon nitride film in a 3D memory structure may be exposed or otherwise vulnerable to one or more etching operations. Thus, it is desirable for the silicon nitride film to be robust and etch-resistant, such as having a low wet etch rate (WER) and/or low dry etch rate (DER). The silicon nitride film may undergo multiple post-processing operations, such as multiple etching operations, and so the WER and the DER may enable the silicon nitride film to be robust under such post-processing operations. In addition, the silicon nitride layer is deposited in a 3D memory structure having high aspect ratio features. High aspect ratio features may include features having a depth to width aspect ratio of greater than 5:1, or greater than 10:1, or greater than 20:1, or greater than 100:1. Thus, it is desirable for the silicon nitride layer to be deposited conformally in the high aspect ratio features. In contrast to CVD and plasma-enhanced CVD processes, ALD processes can ensure relatively good conformality in high aspect ratio features.

Generally, PEALD processes can deposit low WER and highly conformal silicon nitride films within a fairly short ALD cycle time. However, during plasma exposure steps, such as plasma exposure phases 161A and 161B in FIG. 1, the plasma exposure step typically saturates all or almost all available surface ligands with active species of the nitrogen-containing reactant. For example, an ammonia ($NH_3$) plasma may saturate all or almost all available surface ligands with NH or $NH_2$ radicals. Therefore, the $NH_3$ plasma saturates all the adsorbed species of silicon-containing precursor with NH or $NH_2$ radicals, and these series of self-limiting reactions build up the silicon nitride film. The saturation of all or almost all available surface ligands with active species of the nitrogen-containing reactant causes the wafer surface to be "nitridated." This can fundamentally limit the amount of silicon that is incorporated in the silicon nitride film. In turn, this can limit the control of the ratio of silicon to nitrogen concentration in the silicon nitride film. More nitridation or saturation of available surface ligands with active species of nitrogen-containing reactant results in a more nitrogen-rich silicon nitride film.

The refractive index of a film can serve as a marker or indicator of the chemical content of the film. Specifically, the refractive index of the silicon nitride film can be indicative of whether the silicon nitride film is more silicon-rich or nitrogen-rich. The refractive index may also be indicative as to other properties of the silicon nitride film, such as its density, WER, DER, and ability to charge traps as a charge trap layer. A higher refractive index may be indicative of an increased silicon concentration, density, WER, DER, and ability to charge traps as a charge trap layer. With an increased ability to trap charges in the silicon nitride film, the silicon nitride film can effectively toggle on/off in a vertical NAND flash memory structure.

Figure 2:
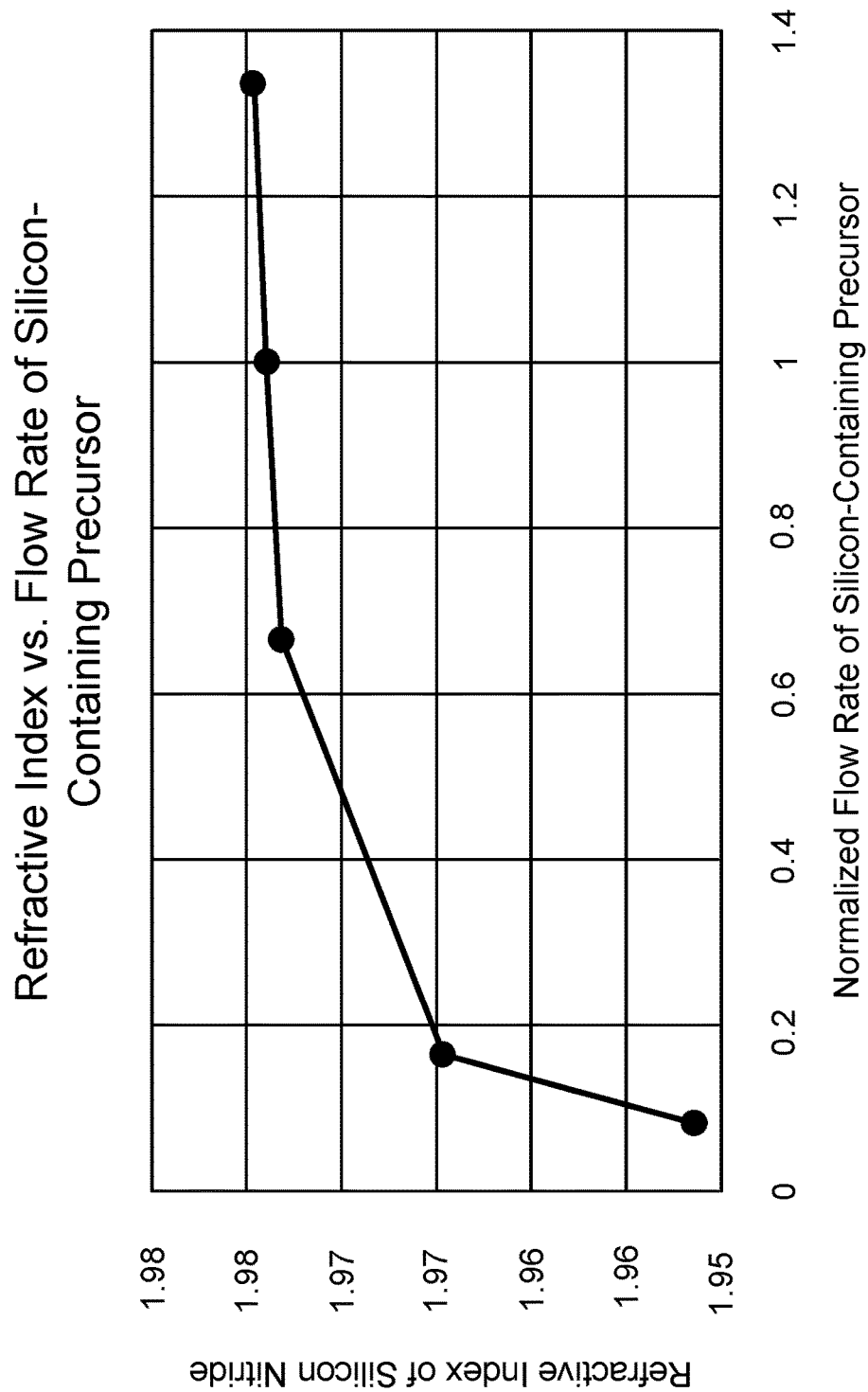
FIG. 2 illustrates a graph showing data for refractive index of a silicon nitride film as a function of flow rate of a silicon-containing precursor.

PEALD processes may be able to obtain a more nitrogen-rich silicon nitride film. However, obtaining a more silicon-rich silicon nitride film may be difficult to achieve in PEALD processes. FIG. 2 illustrates a graph showing data for refractive index of a silicon nitride film as a function of flow rate of a silicon-containing precursor. Using PEALD processes, the graph in FIG. 2 shows how the refractive index of the silicon nitride film increases as the flow rate of the silicon-containing precursor during the dose phases. The dose phases of the silicon-containing precursor can be similar to the dose phases 157A and 157B in FIG. 1. However, even as more silicon-containing precursor is being supplied during the dose phases, the refractive index of the silicon nitride film reaches a limit. In some implementations, conventional PEALD processes are unable to obtain silicon nitride films having a refractive index greater than 2.0, or a refractive index between about 2.0 and about 2.5, or a refractive index between about 2.0 and about 2.1. Not only does this mean that a ratio of silicon to nitrogen concentration reaches a limit with conventional PEALD processes, but other properties like density, WER, DER, and ability to trap charges in a charge trap layer may also reach a limit.

CVD Furnace Reactor

Conventional methods for depositing silicon nitride films having a refractive index greater than 2.0 may be accomplished using CVD furnace reactors. In some implementations, the CVD furnace reactor is a low pressure chemical vapor deposition (LPCVD) furnace reactor. Some CVD furnace reactors can be hot wall systems, which have the advantage of more uniform temperature distributions and reduced convection effects.

Figure 3:
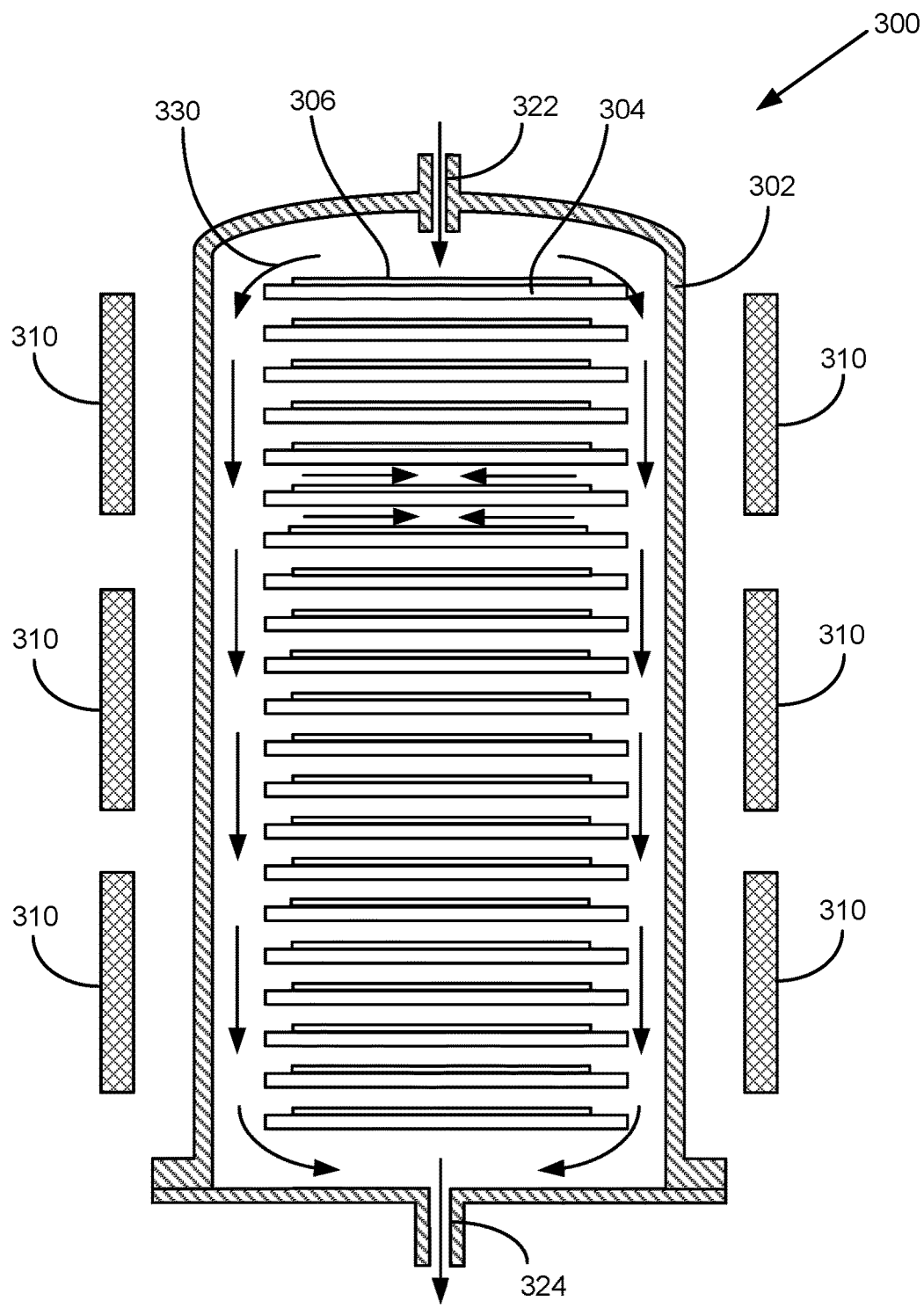
FIG. 3 shows a schematic diagram of an example chemical vapor deposition (CVD) furnace reactor for depositing a silicon nitride film.

FIG. 3 shows a schematic diagram of an example CVD furnace reactor for depositing a silicon nitride film. The CVD furnace reactor 300 can include a plurality of plurality of heaters 310 surrounding a wall 302 of the CVD furnace reactor 300. The plurality of heaters 310 can provide multiple heating zones that allow for some control of the axial temperature along the CVD furnace reactor 300. In some implementations, the temperature range of the CVD furnace reactor 300 is controlled to be between about 300° C. and about 1150° C. The implementation of the CVD furnace reactor 300 in FIG. 3 is a hot wall system.

The CVD furnace reactor 300 can include a plurality of wafers 306 stacked over one another. Each of the wafers 306 may be supported by a wafer support 304 and held by gravity. The wafer-to-wafer spacing along the vertical direction of the CVD furnace reactor 300 can be uniform. This allows for tens or hundreds of wafers 306 to be batch processed in a single run through the CVD furnace reactor 300.

Reactant gases 330 enter the CVD furnace reactor 300 and flow through a gas inlet 322. The reactant gases 330 circulate through the CVD furnace reactor 300 by convection, and flow towards the wafers 306 by diffusion. To deposit silicon nitride films on each of the wafers 306, the CVD furnace reactor 300 can be reduced to a low pressure and heated to a desirable deposition temperature, such as a temperature greater than about 630°, or between about 630° C. and about 800° C., or about 650° C. The gas reactants 330 can be dichlorosilane (DCS) and $NH_3$ that are delivered through the gas inlet 322 and diffuse towards each of the wafers 306. Excess gas reactants 330 may exit the CVD furnace reactor 300 via gas outlet 324. DCS and $NH_3$ will react under high temperatures to form a silicon nitride film, including silicon nitride films having a refractive index greater than 2.0. The high temperature drives the thermal $NH_3$ conversion in order to achieve a high density and low WER. The deposition temperature must remain high (e.g., greater than about 630° C.) in order to achieve a desirable density, a sufficiently low WER, and an adequate throughput, which can place a strain on the overall thermal budget.

Not only does the CVD furnace reactor 300 suffer from straining the overall thermal budget, but the CVD furnace reactor 300 suffers from chemical depletion effects. Because multiple wafers 306 are stacked with relatively small gaps between each of the wafers 306, the reactant gases 330 have to diffuse through the gaps. The spacing between wafers 306 may constrain diffusion so that the fewer reactant gases 330 may be deposited at the center of each wafer 306 than at the edge of each wafer 306. This results in chemical depletion from center-to-edge of each wafer 306, where the thickness of the silicon nitride film is greater at the edge of each wafer 306 than at the center. In addition, the chemical depletion effect can also be seen across the height of the CVD furnace reactor 300, resulting in thickness variations from top to bottom. The chemical depletion effects can degrade conformality of the silicon nitride films on each wafer 306, including across high aspect ratio features of each wafer 306. To reduce the effects of chemical depletion, the spacing between wafers 306 can be increased and fewer wafers 306 can be provided in the CVD furnace reactor 306, but this can adversely affect throughput.

Mixed Mode ALD Process

The present disclosure relates to a method of depositing a nitride film on a wafer using a combination of PEALD processes and thermal ALD processes in a single reactor. Cycles of PEALD processes and cycles of thermal ALD processes can be mixed to deposit a nitride film in a high-throughput, single-wafer reactor. PEALD processes enable low deposition temperatures, high conformality all over the wafer, and tight wafer-to-wafer control at high throughput. Thermal ALD processes enable greater tuning of material properties of the nitride film, including properties such as refractive index, relative concentration of different elements, density, WER, DER, and ability to charge traps in a charge trap layer. PEALD processes and thermal ALD processes can operate at similar wafer temperatures in the single reactor. In some implementations, the wafer temperature can be maintained at a temperature between about 500° and about 630° C. during both PEALD and thermal ALD cycles. PEALD and thermal ALD cycles can be performed sequentially and repeatedly to allow for fine-tuning of properties of the nitride film that might not be achieved by PEALD cycles alone.

In some implementations, the nitride film is a silicon nitride film. By combining PEALD and thermal ALD cycles in a mixed mode ALD process, properties of the silicon nitride film can be tuned in a manner that PEALD processes may not be able to otherwise achieve. For example, the silicon nitride film can have a refractive index of greater than about 2.0, or between about 2.0 and about 2.5, or between about 2.0 and about 2.1. In some implementations, a ratio of silicon to nitrogen concentration in the silicon nitride film is between 1.2:1 and 1.8:1. For example, a stoichiometric ratio of 1.33:1 of silicon to nitrogen concentration in the silicon nitride film can be achieved using a mixed mode ALD process. Generally, a more stoichiometric ratio of silicon nitride is freer of defects. Improved properties of the silicon nitride film can be achieved using a mixed mode ALD process compared to conventional PEALD processes. Moreover, the mixed mode ALD process does not suffer as much from chemical depletion effects and high deposition temperatures, where the high deposition temperatures can constrain thermal budget in a CVD furnace reactor.

The wafer can include any semiconductor wafer, partially integrated circuit, printed circuit board, or other appropriate work piece. Process conditions may vary depending on the wafer size. Typically, many fabrication facilities are configured for 200-mm wafers, 300-mm, or 450-mm wafers. The disclosed implementations described herein are configured to operate on any suitable wafer size, such as 300-mm and 450-mm wafer technologies. In some implementations, the nitride film is deposited on a wafer having a plurality of features, where each of the features have a depth to width aspect ratio of greater than about 10:1, greater than about 20:1, or greater than about 100:1. In some implementations, the features may be part of a 3D memory structure, such as a vertical NAND flash memory structure.

Figure 4:
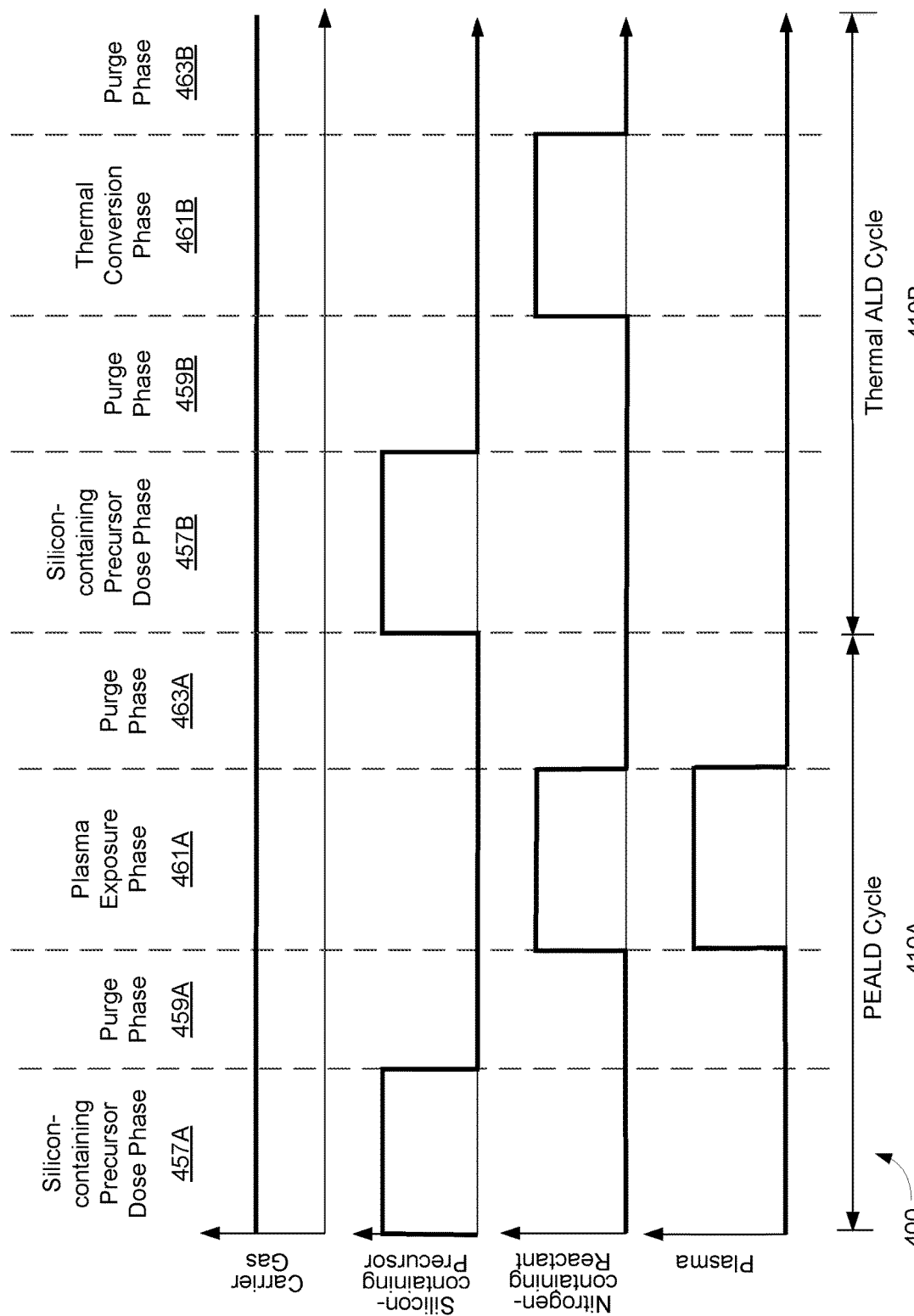
FIG. 4 illustrates an example timing sequence diagram showing a plasma-enhanced atomic layer deposition (PEALD) cycle and a thermal ALD cycle for depositing a silicon nitride film.

FIG. 4 illustrates an example timing sequence diagram showing a PEALD cycle and a thermal ALD cycle for depositing a silicon nitride film. FIG. 4 shows phases in a PEALD cycle 410A and a thermal ALD cycle 410B. FIG. 4 shows various process parameters, such as carrier gas or purge gas flow, plasma, silicon-containing precursor flow, and nitrogen-containing reactant flow across the PEALD cycle 410A and the thermal ALD cycle 410B. The lines indicate when the flow is turned on and off, or when plasma is turned on and off. Example process parameters include, but are not limited to, flow rates for inert and reactant species, plasma power and frequency, wafer temperature, and process chamber pressure.

Figure 5:
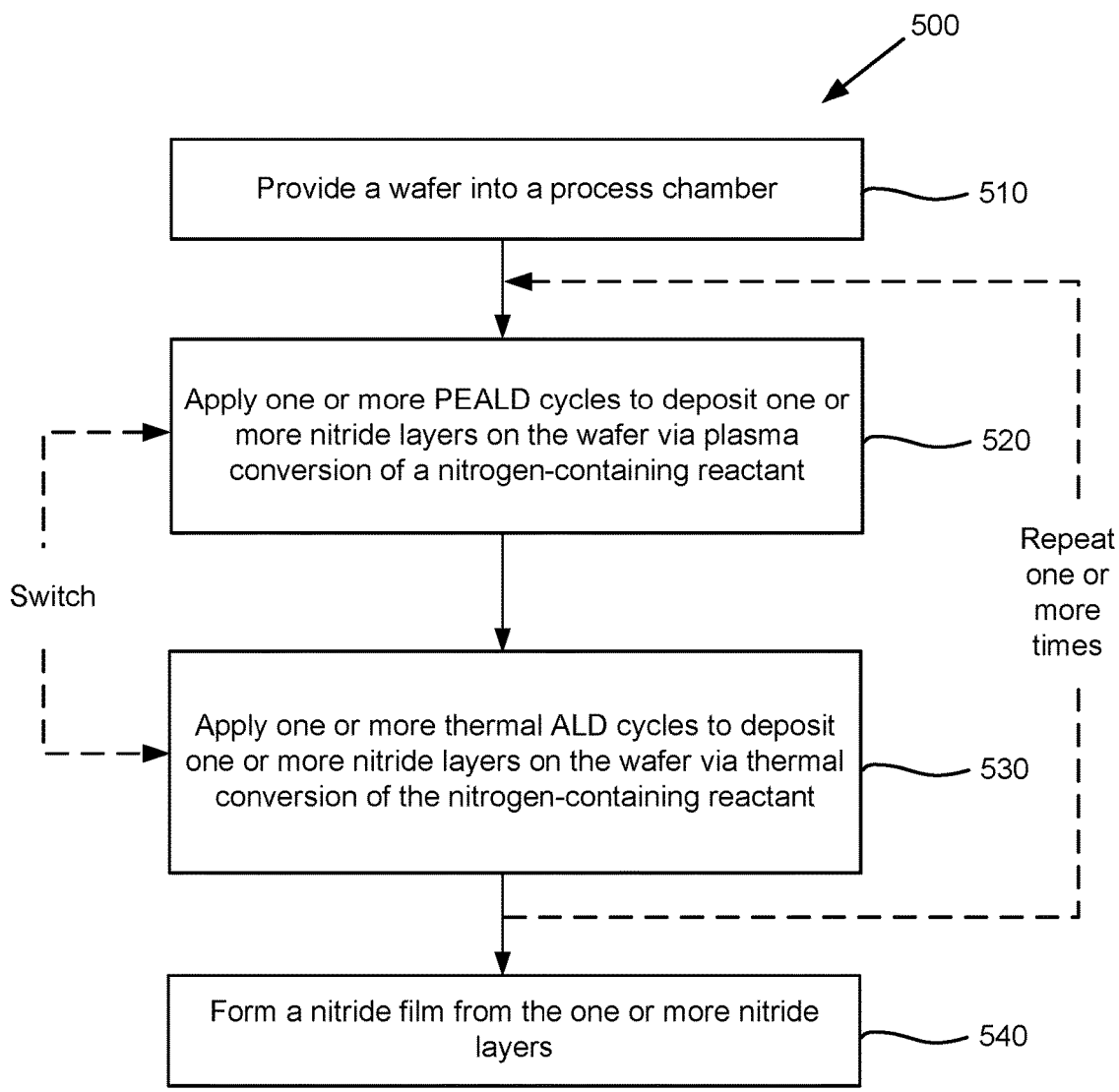
FIG. 5 shows a flow diagram of an example process for depositing a nitride film.

FIG. 5 shows a flow diagram of an example process for depositing a nitride film. The operations in a process 500 of FIG. 5 may be performed in different orders and/or with different, fewer, or additional operations. In some implementations, the operations in the process 500 may be performed by the process chamber shown in FIG. 7A, the single-station module shown in FIG. 7B, and/or the process tool shown in FIG. 8. In some implementations, the operations of the process 500 may be implemented, at least in part, according to software stored on one or more non-transitory computer readable media. FIGS. 4 and 5 will be described together below.

At block 510 of the process 500, a wafer is provided into a process chamber. The wafer may be a silicon wafer, such as a 200-mm, 300-mm, or a 450-mm wafer, including wafers having one or more layers of material, such as dielectric, conducting, or semiconducting material deposited thereon. The wafer may have "features" such as vias, trenches, recesses, or holes, which may be characterized by one or more narrow and/or re-entrant openings within the feature, and high aspect ratios. The feature may be formed in one or more of the above-described layers. One example of a feature is a hole or via in a semiconductor wafer or a layer on the wafer. Another example is a trench in a wafer or layer. In some implementations, the feature may have an under-layer, such as a barrier layer or adhesion layer. Non-limiting examples of under-layers include dielectric layers and conducting layers, such as silicon oxides, silicon nitrides, silicon carbides, metal oxides, metal nitrides, metal carbides, and metal layers.

In some implementations, the feature may have a depth to width aspect ratio of at least about 2:1, at least about 5:1, at least about 10:1, at least about 20:1, at least about 100:1, or higher. The feature may also have a dimension near the opening, such as an opening diameter or line width of between about 10 nm to 500 nm, for example between about 25 nm and about 300 nm. Disclosed methods may be performed on wafers with features having an opening less than about 150 nm. A feature via or trench may be referred to as an unfilled feature or a feature. A feature may have a re-entrant profile that narrows from the bottom, closed end, or interior of the feature to the feature opening.

At block 520 of the process 500, one or more PEALD cycles are applied to deposit one or more nitride layers on the wafer via plasma conversion of a nitrogen-containing reactant. Any suitable number of PEALD cycles may be applied at block 520 prior to applying thermal ALD cycles or after applying thermal ALD cycles. Accordingly, block 520 and block 530 of the process 500 may be switched. In FIG. 4, each PEALD cycle 410A can be broken down in a series of phases, including a dose phase 457A, a purge phase 459A, a plasma exposure phase 461A, and a purge phase 463A.

During the dose phase 457A, a first dose of a silicon-containing precursor is introduced in a vapor phase to the wafer. During the dose phase 457A, plasma is turned off, no nitrogen-containing reactant is flowed to the wafer, and a carrier gas, such as argon, continues to flow. In some implementations, the wafer is exposed to the silicon-containing precursor for a time between about 0.1 seconds and about 60 seconds, or between about 0.2 seconds and about 10 seconds, or between about 2 seconds and about 10 seconds, depending on the flow rate and the wafer surface area. In some implementations, the silicon-containing precursor can be delivered at a flow rate of between about 20 sccm and about 5,000 sccm, such as between about 1,000 sccm and about 4,000 sccm. In some implementations, the silicon-containing precursor includes a halogenated silane.

When the wafer is exposed to the silicon-containing precursor, the silicon-containing precursor adsorbs onto the surface of the wafer, thereby forming an adsorbed layer of the silicon-containing precursor. In some implementations, the silicon-containing precursor adsorbs onto the wafer surface in a self-limiting manner such that once active sites are occupied by the silicon-containing precursor, little or no additional silicon-containing precursor will be adsorbed on the wafer surface. For example, silicon-containing precursors may be adsorbed onto at least about 60% of the wafer surface. When the silicon-containing precursor adsorbs onto active sites on the surface of the wafer, a thin layer of the silicon-containing precursor forms on the surface. In various implementations, this layer may be less than a monolayer, and may have a thickness between about 0.1 Å and about 0.5 Å.

A silicon-containing precursor is a reagent or mixture of reagents used to make a silicon-containing film, where the reagent or reagent mixture includes at least one silicon compound. In some implementations, the silicon-containing precursor may be, for example, a silane, a halosilane, or an aminosilane. A halogen-free silane contains hydrogen and/or carbon groups, but does not contain a halogen. Examples of halogen-free silanes are silane ($SiH_4$), disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain implementations described herein, the silicon-containing precursor is not present when plasma is struck. Specific chlorosilanes are hexachlorodisilane ($Si_2Cl_6$), tetrachlorosilane ($SiCl_4$), trichlorosilane ($HSiCl_3$), dichlorosilane ($H_2SiCl_2$), monochlorosilane (Cl-$SiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, SiHCl—$(N(CH_3)_2)_2$, $(Si(CH_3)_2NH)_3$ and the like. A further example of an aminosilane is trisilylamine ($N(SiH_3)$).

In some implementations, the PEALD cycle 410A may include a purge phase 459A. In purge phase 459A, a process chamber is optionally purged to remove excess silicon-containing precursor in a vapor phase that did not adsorb onto the surface of the wafer. Purging may involve a sweep gas, which may be a carrier gas used in other operations or a different gas. In some implementations, purging may involve evacuating the process chamber. During purge phase 459A, silicon-containing precursor flow is turned off, no plasma is ignited, and no nitrogen-containing reactant is supplied to the process chamber. The carrier gas, such as argon, continues to flow to purge any excess silicon-containing precursor from the process chamber. In some implementations, purge phase 459A may include one or more evacuation subphases for evacuating the process chamber. Alternatively, it will be appreciated that the purge phase 459A may be omitted in some implementations. The purge phase 459A may have any suitable duration, such as between about 0 seconds and about 60 seconds, or between about 0.1 and about 20 seconds, or between about 2 seconds and about 10 seconds. In some implementations, the flow rate of carrier gas can be between about 250 sccm to about 10,000 sccm, or between about 2,000 sccm and about 6,000 sccm during the purge phase 459A. In some implementations, increasing a flow rate of one or more sweep gases may decrease the duration of the purge phase 459A. For example, a purge gas flow rate may be adjusted according to various reactant thermodynamic characteristics and/or geometric characteristics of the process chamber and/or process chamber plumbing for modifying the duration of the purge phase 459A. In one non-limiting example, the duration of a sweep phase may be adjusted by modulating sweep gas flow rate. This may reduce deposition cycle time, which may improve wafer throughput. After a purge, the silicon-containing precursors remain adsorbed onto the wafer surface.

In some implementations, the PEALD cycle includes exposing the wafer to a plasma of the nitrogen-containing reactant. A plasma may be ignited during plasma exposure phase 461A. Accordingly, flow of nitrogen-containing reactant and plasma are both turned on during the plasma exposure phase 461A. In some implementations, flow of nitrogen-containing reactant may be turned on prior to turning on the plasma. Flow of silicon-containing precursor is turned off during the plasma exposure phase 461A, and inert gas continues to flow. In some implementations, the wafer may be exposed to the plasma of the nitrogen-containing reactant for a duration between about 0.1 seconds and about 60 seconds, or between about 0.5 seconds and about 10 seconds. In some implementations, the nitrogen-containing reactant includes an amine or ammonia.

A nitrogen-containing reactant includes at least one nitrogen, for example, ammonia, hydrazine, amines (amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants.

Plasma can refer to a plasma ignited in the process chamber (i.e., in-situ plasma) or remotely and brought into the process chamber. It will be appreciated that plasmas for PEALD processes may be formed by capacitive coupling or other suitable methods, such as inductive coupling. The plasma may include ions, radicals, and other active species of the nitrogen-containing reactant. For example, $NH_3$ molecules can dissociate in an $NH_3$ plasma to form various ions, radicals, and other active species of $NH_3$. For example, the plasma can include radicals of $NH_2$ and NH. Other reactants and other reagents may be present in the process chamber when the plasma is ignited.

During the plasma exposure phase 461A, an RF field can be provided to activate the nitrogen-containing reactant into ions, radicals, and other active species which react with the adsorbed layer of the silicon-containing precursor. Without being bound by any particular theory, higher frequency plasmas may generate more radicals than ions, which can improve deposition of silicon nitride due to higher reactivity between the radicals and the silicon-containing precursor. In various implementations, a high frequency plasma is used having a frequency of at least about 13.56 MHz, or at least about 27 MHz, or at least about 40 MHz, or at least about 60 MHz. Once the nitrogen-containing reactant is activated to form plasma, the ions, radicals, and other active species of the nitrogen-containing reactant react with the silicon-containing precursor adsorbed on the surface of the wafer, thereby forming a thin film of silicon nitride. In other words, the nitrogen-containing reactant can be converted to a thin film of silicon nitride via plasma conversion.

Next, the plasma is extinguished and the process chamber is purged during a purge phase 463A. Silicon-containing precursor flow is turned off, no plasma is ignited, and no nitrogen-containing reactant is supplied to the process chamber. The purge may be performed by flowing the carrier gas or any other inert gas. The purge phase 463A may be similar to the purge phase 459A.

In some implementations, each of the dose phase 457A, the purge phase 459A, the plasma exposure phase 461A, and the purge phase 463A can be maintained at an elevated temperature. The elevated temperature can be applied to the wafer via a wafer support or pedestal. In some implementations, the elevated temperature is at least equal to or greater than about 500° C., or between about 500° C. and about 630° C. The dose phase 457A can serve to thermally convert the silicon-containing precursor, while the plasma exposure phase 461A can serve to convert the nitrogen-containing reactant via plasma. The elevated temperature can be maintained throughout the PEALD cycle 410A, where the elevated temperature is less than a temperature for depositing a thin film of silicon nitride in a CVD furnace reactor.

Returning to FIG. 5, at block 530 of the process 500, one or more thermal ALD cycles are applied to deposit one or more nitride layers on the wafer via thermal conversion of the nitrogen-containing reactant. The nitrogen-containing reactant can at least be partially converted to one or more nitride layers during the one or more thermal ALD cycles. In some implementations, a number of thermal ALD cycles are equal to or greater than a number of PEALD cycles. Any suitable number of thermal ALD cycles may be applied at block 530 prior to applying PEALD cycles or after applying PEALD cycles. Blocks 520 and 530 are performed sequentially rather than simultaneously. Block 520 may be performed in sequence before block 530 in some implementations. Block 530 may be performed in sequence before block 520 in some other implementations. Thus, as shown in FIG. 5, the order for performing blocks 520 and 530 may be switched. In FIG. 4, each thermal ALD cycle 410B can be broken down in a series of phases, including a dose phase 457B, a purge phase 459B, a thermal conversion phase 461B, and a purge phase 463B.

During the dose phase 457B, a second dose of a silicon-containing precursor is introduced in a vapor phase to the wafer. During the dose phase 457B, plasma is turned off, no nitrogen-containing reactant is flowed to the wafer, and a carrier gas, such as argon, continues to flow. In some implementations, the wafer is exposed to the silicon-containing precursor for a time between about 0.1 seconds and about 60 seconds, or between about 0.5 seconds and about 30 seconds, or between about 2 seconds and about 10 seconds, depending on the flow rate and the wafer surface area. In some implementations, the silicon-containing precursor can be delivered at a flow rate of between about 20 sccm and about 5,000 sccm, such as between about 1,000 sccm and about 4,000 sccm. The silicon-containing precursor adsorbs onto the surface of the wafer, thereby forming an adsorbed layer of the silicon-containing precursor. In some implementations, the silicon-containing precursor in the dose phase 461B can be the same silicon-containing precursor introduced in the dose phase 461A. However, in some implementations, the silicon-containing precursor in the dose phase 461B can be different from the silicon-containing precursor introduced in the dose phase 461A.

In some implementations, the thermal ALD cycle 410B may include a purge phase 459B. The purge phase 459B may have similar characteristics as the purge phase 459A in the PEALD cycle 410A. In purge phase 459B, the process chamber is optionally purged to remove excess silicon-containing precursor in a vapor phase that did not adsorb onto the surface of the wafer. Purging may involve a sweep gas, which may be a carrier gas used in other operations or a different gas. In some implementations, purging may involve evacuating the process chamber. During purge phase 459B, silicon-containing precursor flow is turned off, no plasma is ignited, and no nitrogen-containing reactant is supplied to the process chamber. The carrier gas, such as argon, continues to flow to purge any excess silicon-containing precursor from the process chamber. The purge phase 459B may have any suitable duration, such as between about 0 seconds and about 60 seconds, or between about 0.1 and about 20 seconds, or between about 2 seconds and about 10 seconds. In some implementations, the flow rate of carrier gas can be between about 250 sccm to about 10,000 sccm, or between about 2,000 sccm and about 6,000 sccm during the purge phase 459B. After a purge, the silicon-containing precursors remain adsorbed onto the wafer surface.

In some implementations, the thermal ALD cycle 410B includes exposing the wafer to a nitrogen-containing reactant at an elevated temperature. The elevated temperature can be applied to the wafer via a wafer support or pedestal. At the elevated temperature, the nitrogen-containing precursor can undergo a dissociation reaction, and the dissociated species can react with the adsorbed silicon-containing precursor on the surface of the wafer to form a silicon nitride layer. The heat at the elevated temperature can thermodynamically drive adsorbed reactants to undergo a surface chemical reaction to form a stable thin film. Accordingly, the thermal ALD cycle 410B includes a thermal conversion phase 461B for reacting a nitrogen-containing reactant with the adsorbed silicon-containing precursor. In some implementations, the nitrogen-containing reactant in the thermal conversion phase 461B is the same as the nitrogen-containing reactant in the plasma exposure phase 461A. However, in some implementations, the nitrogen-containing reactant in the thermal conversion phase 461B is different than the nitrogen-containing reactant in the plasma exposure phase 461A.

During the thermal conversion phase 461B, no plasma is ignited. Flow of nitrogen-containing reactant is turned on during the thermal conversion phase 461B. Flow of silicon-containing precursor is turned off during the thermal conversion phase 461B, and inert gas continues to flow.

In some implementations, a duration of the thermal conversion phase 461B can be between about 0.1 seconds and about 60 seconds, or between about 0.5 seconds and about 10 seconds. In some implementations, the duration of the thermal conversion phase 461B is greater than the duration of the plasma exposure phase 461A.

In some implementations, the elevated temperature during the thermal conversion phase 461B can heat the wafer to a temperature equal to or greater than about 500° C., or between about 500° C. and about 630° C. The elevated temperature for thermal conversion of the nitrogen-containing reactant can be less than the elevated temperature used in a CVD furnace reactor, which can reduce overall thermal budget. The elevated temperature can be maintained throughout the thermal ALD cycle 410B. The elevated temperature of the wafer can be achieved by heating a wafer support or pedestal. In some implementations, the remainder of the process chamber is not heated. That way, the walls of the process chamber can remain colder than the wafer and the wafer support. In some implementations, the elevated temperature during the thermal conversion phase 461B can be the same as during the plasma exposure phase 461A.

Typically, the kinetics of thermodynamically driving the chemical reaction to form a nitride layer is relatively slow. Because of the unfavorable kinetics for converting a nitrogen-containing reactant with thermal ALD, it is not desirable to use thermal ALD to form a nitride layer. Thermal ALD is more commonly used for depositing other types of layers, such as oxide layers. However, when a thermal ALD cycle 410B is used in conjunction with a PEALD cycle 410A, the mixed ALD modes may form a nitride layer without being substantially limited by the slower kinetics of thermal ALD.

In some implementations during the thermal conversion phase 461B, the nitrogen-containing reactant is broken down to react with the adsorbed silicon-containing precursor. For example, $NH_3$ molecules can be broken down to react with silicon. In some implementations, the $NH_3$ molecules can be broken down to react with silicon during the thermal conversion phase 461B, whereas $NH_3$ molecules can dissociate into radicals of $NH_2$ and NH during the plasma exposure phase 461A.

Without being bound by any particular theory, the plasma exposure phase 461A can dissociate the nitrogen-containing reactant into more reactive species that quickly saturates the wafer surface and reacts with the adsorbed silicon-containing precursors. The thermal conversion phase 461B can dissociate the nitrogen-containing reactant into fewer reactive species over a longer period of time, which then react with the adsorbed silicon-containing precursors. By way of an example, if the nitrogen-containing reactant were $NH_3$, then there may be fewer molecules with enough energy to overcome the activation energy barrier for the following reaction: $Si-H+N-H \rightarrow SiN+H_2$. By varying the time of thermal conversion, the amount of nitrogen incorporation in the film can be controlled. The thermal conversion phase 461B can lead to silicon nitride films that are richer in silicon than the plasma exposure phase 461A. However, the plasma exposure phase 461A can lead to silicon nitride films that are richer in nitrogen than the thermal conversion phase 461B.

After the thermal conversion phase 461B, the process chamber is purged during a purge phase 463B. Silicon-containing precursor flow is turned off, no plasma is ignited, and no nitrogen-containing reactant is supplied to the process chamber. The purge may be performed by flowing the carrier gas or any other inert gas. The purge phase 463B may be similar to the purge phase 463A.

Returning to FIG. 5, in some implementations, blocks 520 and 530 may be repeated one or more times. Block 520 may represent a series of PEALD cycles and block 530 may represent a series of thermal ALD cycles, where block 520 and block 530 may be part of a larger mixed mode ALD cycle. Each mixed mode ALD cycle can be repeated a certain number of times to achieve a desired thickness of a nitride film.

At block 540 of the process 500, a nitride film is formed from the one or more nitride layers. As one or more PEALD cycles deposit one or more nitride layers and as one or more thermal ALD cycles also deposit one or more nitride layers, a nitride film can be formed. The one or more nitride layers from the PEALD cycles can be more nitrogen-rich than the one or more nitride layers from the thermal ALD cycles. In some implementations, a number of the one or more thermal ALD cycles is equal to or greater than a number of the one or more PEALD cycles. The one or more PEALD cycles and the one or more thermal ALD cycles can be performed in any sequence in the same process chamber, and repeated.

Performing operations 457A, 459A, 461A, and 463A may constitute a PEALD cycle 410A. Performing operations 457B, 459B, 461B, and 463B may constitute a thermal ALD cycle 410B. Depending on the dose time and the exposure times of the operations, each cycle may deposit a silicon nitride layer having a thickness between about 0.05 Å and about 2 Å. The aforementioned cycles may be mixed and repeated until a desired film thickness of silicon nitride is achieved.

In some implementations, X number of PEALD cycles 410A may be performed in a mixed mode ALD cycle, and Y number of thermal ALD cycles 410B may be performed in the mixed mode ALD cycle. X number of PEALD cycles 410A may be combined with Y number of thermal ALD cycles 410B to form a mixed mode ALD cycle. The mixed mode ALD cycle can be repeated Z number of times until a desired thickness of a thin film is achieved. In some implementations, a typical deposition rate is between about 2 Å per mixed mode ALD cycle and about 10 Å per mixed mode ALD cycle, such as about 6.6 Å per mixed mode ALD cycle. The mixed mode ALD cycle is essentially two nested loops of X number of PEALD cycles 410A and Y number of thermal ALD cycles 410B contained within an overarching mixed mode ALD cycle. In some implementations, a number of thermal ALD cycles 410A is equal to or greater than a number of PEALD cycles 410B in each mixed mode ALD cycle.

In some implementations, the values of X and Y may influence a concentration ratio of elements in a thin film. For example, the values of X and Y may influence a ratio of silicon to nitrogen concentration in a silicon nitride film, thereby influencing a refractive index of the silicon nitride film. By adjusting the values of X and Y in a mixed mode ALD cycle, fine-tuning of properties of the thin film can occur, including fine-tuning of properties such as concentration ratio of elements, refractive index, density, WER, DER, ability to trap charges in a charge trap layer, etc. For example, a greater number of thermal ALD cycles in a mixed mode ALD cycle can tune for a more silicon-rich thin film, whereas a greater number of PEALD cycles in a mixed mode ALD cycle can tune for a more nitrogen-rich thin film.

Figure 6:
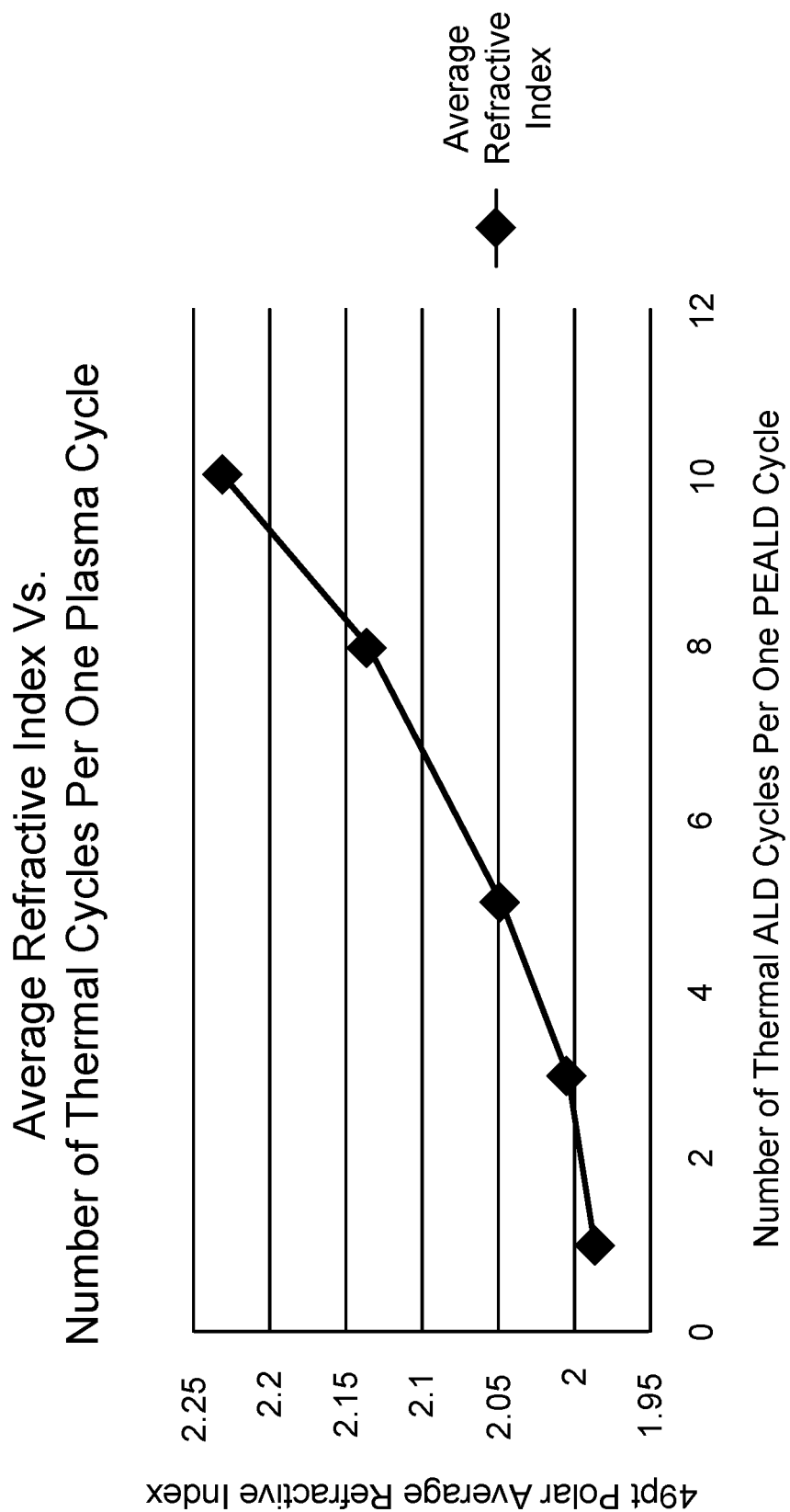
FIG. 6 illustrates a graph showing data for refractive index of a silicon nitride film as a function of number of thermal ALD cycles per one PEALD cycle.

FIG. 6 illustrates a graph showing data for refractive index of a silicon nitride film as a function of number of thermal ALD cycles per one PEALD cycle. The graph shows how the refractive index of the silicon nitride film can be tuned by increasing the ratio of thermal ALD cycles to PEALD cycles in each mixed mode ALD cycle. In the graph, a ratio of 5:1 of thermal ALD cycles to PEALD cycles in each mixed mode ALD cycle yields a refractive index of 2.05. A ratio of 10:1 of thermal ALD cycles to PEALD cycles in each mixed mode ALD cycle yields a refractive index of greater than 2.20. In contrast to the graph in FIG. 2 where the refractive index of the silicon nitride film reaches a limit at 2.0, the refractive index of the silicon nitride film in the graph in FIG. 6 continues to increase beyond 2.0. The increase in refractive index reflects an increase in the ratio of silicon to nitrogen concentration. In implementations involving vertical NAND flash memory structures, control of this ratio can optimize program and erase voltages.

The mixed mode ALD process can provide a number of advantages over conventional PEALD processes and CVD processes. The mixed mode ALD process allows for greater fine-tuning of properties of the deposited thin film over conventional PEALD processes, including properties such as concentration ratio of elements, refractive index, density, WER, DER, ability to trap charges in a charge trap layer, etc. PEALD processes can be limited by saturation of available ligand sites during a plasma exposure phase. The mixed mode ALD process incorporates thermal ALD cycles to permit fine-tuning of properties without significantly compromising throughput, conformality, and overall thermal budget. By incorporating PEALD cycles with thermal ALD cycles, the mixed mode ALD cycle can be fast and provide a thin film with a low WER and high conformality (i.e., step coverage). In some implementations, the thin film can have a WER that is less than 10 Å per minute in 100:1 dilute HF, or less than 5 Å per minute in 100:1 dilute HF. In some implementations, the deposited thin film can have a step coverage of greater than 80%, greater than 90%, or greater than 95%. Such a high step coverage can be achieved even in high aspect ratio features.

In addition to fine-tuning properties of the thin film by adjusting the values of X and Y in a mixed mode ALD process, process conditions for each nested PEALD cycle and thermal ALD cycle can be adjusted to influence the properties of the thin film. Table I shows an example of process conditions and suitable ranges for depositing a silicon nitride film using a mixture of PEALD cycles and thermal ALD cycles. As shown in Table I, many of the process conditions can be maintained in PEALD and thermal ALD cycles in the same process chamber. Process conditions such as wafer temperature, dose pressure, conversion pressure, flow rate of the silicon-containing precursor, and the flow rate of the nitrogen-containing reactant can be identical across the PEALD cycle and the thermal ALD cycle. However, the example process conditions shown in Table I show that the process conditions for the thermal ALD cycle can have a longer dose time for the silicon-containing precursor, no plasma power, and a longer conversion time for converting the nitrogen-containing reactant.

TABLE I

| Parameter | PEALD | Thermal ALD | Range |
|---|---|---|---|
| Wafer temperature (° C.) | 565 | 565 | 500-630 |
| Dose Flow Rate of Silicon-Containing Precursor (sccm) | 3,300 | 3,300 | 20-5,000 |
| Dose Time (s) | 6 | 10 | 0.1-30 |
| Dose Pressure (Torr) | 7 | 7 | 0.5-20 |

TABLE I-continued

| Parameter | PEALD | Thermal ALD | Range |
|---|---|---|---|
| Pump Time (s) | 8 | 8 | 0.1-20 |
| Purge Flow (sccm) | 4,500 | 4,500 | 250-10,000 |
| Purge Time (s) | 6 | 6 | 0.1-20 |
| Flow Rate of Nitrogen-Containing Reactant (sccm) | 1,650 | 1,650 | 10-10,000 |
| Plasma Power (W) | 175 | 0 | 25-1,500 |
| Conversion Pressure (Torr) | 2 | 2 | 0.5-20 |
| Conversion Time (s) | 2 | 2.7 | 0.1-60 |
| Pump Time (s) | 1 | 1 | 0.1-20 |
| Purge Flow (sccm) | 4,500 | 4,500 | 250-10,000 |
| Purge Time (s) | 2 | 2 | 0.1-20 |

Apparatus

Figure 7A:
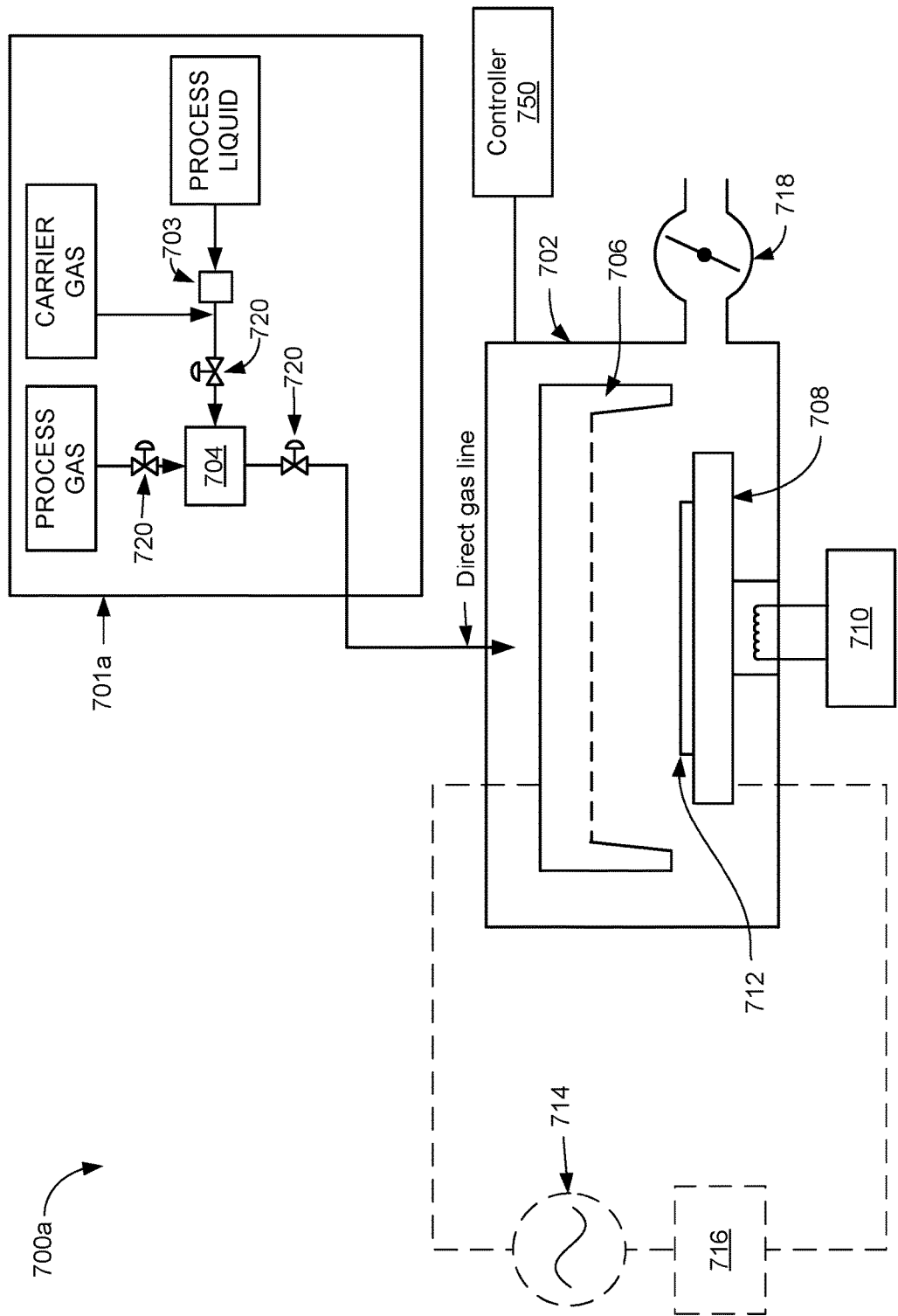
FIG. 7A is a schematic diagram of an example process chamber for depositing a nitride film via PEALD and thermal ALD cycles.
Figure 8:
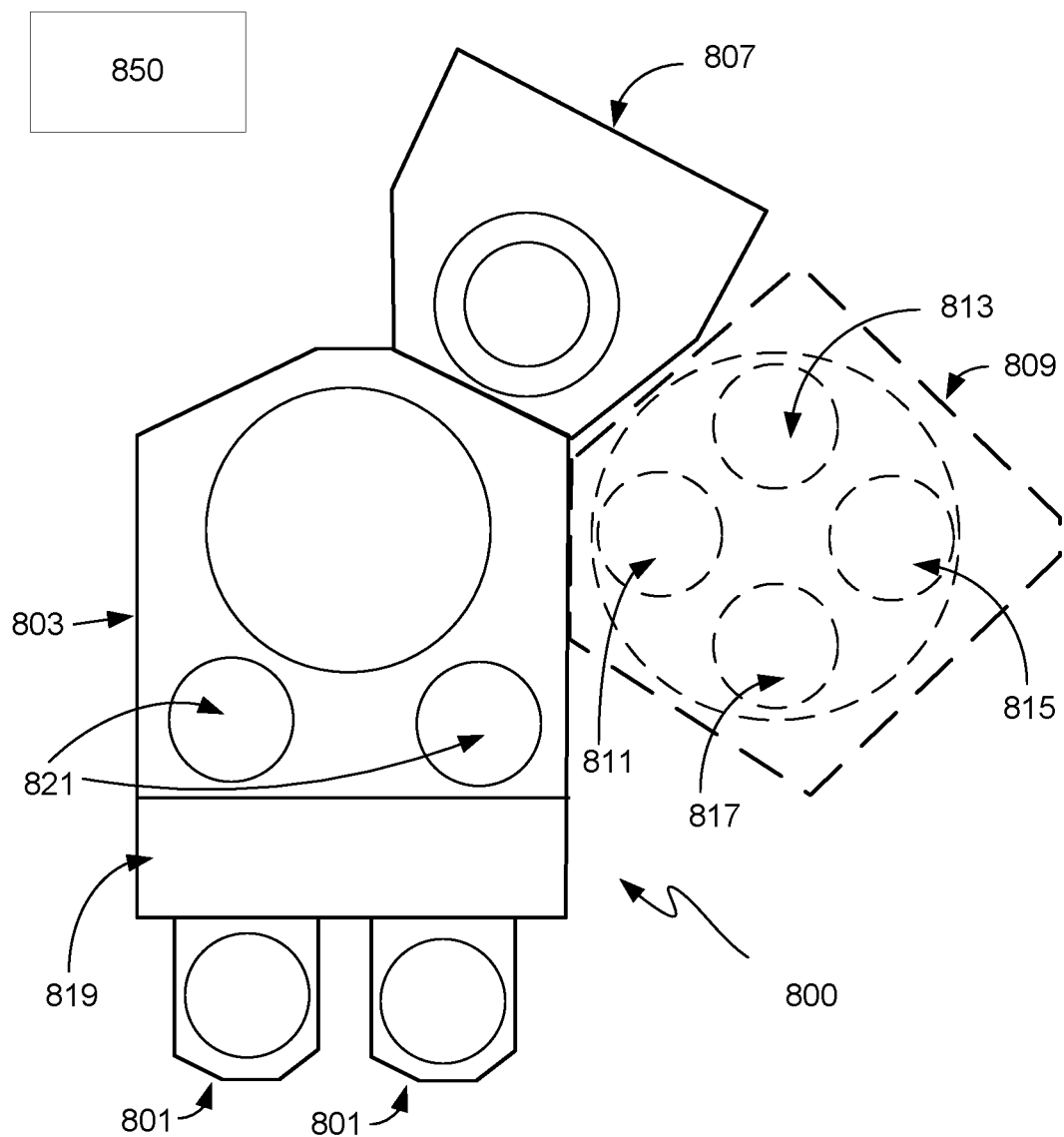
FIG. 8 is a schematic diagram of an example process tool for performing the disclosed implementations.

FIG. 7A is a schematic diagram of an example apparatus for depositing a nitride film via PEALD and thermal ALD cycles. The apparatus or process station 700a includes a process chamber 702 for maintaining a low-pressure environment. A plurality of apparatuses or process stations 700a may be included in a common low pressure process tool environment. For example, FIG. 8 depicts an implementation of a multi-station processing tool 800. In some implementations, one or more hardware parameters of the apparatus or process station 700a including those discussed in detail below may be adjusted programmatically by one or more system controllers 750. The apparatus or process station 700a can be capable of performing the mixed mode ALD cycle described above, including one or more PEALD cycles and one or more thermal ALD cycles, to deposit a nitride film on a wafer 712.

The apparatus or process station 700a fluidly communicates with reactant delivery system 701a for delivering process gases to a distribution showerhead 706. Reactant delivery system 701a includes a mixing vessel 704 for blending and/or conditioning process gases, such as a silicon-containing precursor in the vapor phase, for delivery to showerhead 706. In some implementations, the reactant delivery system includes a mixing vessel 704 for blending and/or conditioning a nitrogen-containing reactant (e.g., ammonia) for delivery to showerhead 706. One or more mixing vessel inlet valves 720 may control introduction of process gases to mixing vessel 704. Plasma of the nitrogen-containing reactant may also be delivered to the showerhead 706 or may be generated in the apparatus or process station 700a.

As an example, the implementation of FIG. 7A includes a vaporization point 703 for vaporizing liquid reactant to be supplied to the mixing vessel 704. In some implementations, vaporization point 703 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some implementations, delivery piping downstream of vaporization point 703 may be heat traced. In some examples, mixing vessel 704 may also be heat traced. In one non-limiting example, piping downstream of vaporization point 703 has an increasing temperature profile extending from approximately 100° C. to approximately 150° C. at mixing vessel 704.

In some implementations, liquid precursor or liquid reactant may be vaporized at a liquid injector. For example, a liquid injector may inject pulses of a liquid reactant into a carrier gas stream upstream of the mixing vessel 704. In one implementation, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 703. In one scenario, a liquid injector may be mounted directly to mixing vessel 704. In another scenario, a liquid injector may be mounted directly to showerhead 706.

In some implementations, a liquid flow controller (LFC) upstream of vaporization point 703 may be provided for controlling a mass flow of liquid for vaporization and delivery to the apparatus or process station 700a. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some implementations, the LFC may be dynamically switched between a feedback control mode and a direct control mode. In some implementations, this may be performed by disabling a sense tube of the LFC and the PID controller.

Showerhead 706 distributes process gases toward a wafer 712. In the implementation shown in FIG. 7A, the wafer 712 is located beneath the showerhead 706 and is shown resting on a pedestal 708. Showerhead 706 may have any suitable shape, and may have any suitable number and arrangement of ports for distributing process gases to wafer 712.

In some implementations, pedestal 708 may be raised or lowered to expose wafer 712 to a volume between the wafer 712 and the showerhead 706. It will be appreciated that, in some implementations, pedestal height may be adjusted programmatically by a suitable system controller 750.

In another scenario, adjusting a height of pedestal 708 may allow a plasma density to be varied during plasma activation cycles included in the process. At the conclusion of a processing phase, pedestal 708 may be lowered during another wafer transfer phase to allow removal of wafer 712 from pedestal 708.

In some implementations, pedestal 708 may be temperature controlled via heater 710. In some implementations, the pedestal 708 may be heated to a temperature less than about 650° C., such as about between about 500° C. and about 630° C., during deposition of silicon nitride films as described in disclosed implementations. Further, in some implementations, pressure control for the apparatus or process station 700a may be provided by a butterfly valve 718. As shown in the implementation of FIG. 7A, the butterfly valve 718 throttles a vacuum provided by a downstream vacuum pump (not shown). However, in some implementations, pressure control of apparatus or process station 700a may also be adjusted by varying a flow rate of one or more gases introduced to the apparatus or process station 700a.

In some implementations, a position of the showerhead 706 may be adjusted relative to the pedestal 708 to vary a volume between the wafer 712 and the showerhead 706. Further, it will be appreciated that a vertical position of pedestal 708 and/or showerhead 706 may be varied by any suitable mechanism within the scope of the present disclosure. In some implementations, pedestal 708 may include a rotational axis for rotating an orientation of wafer 712. It will be appreciated that, in some implementations, one or more of these example adjustments may be performed programmatically by one or more suitable system controllers 750.

In some implementations where plasma may be used as discussed above, showerhead 706 and pedestal 708 electrically communicate with a radio frequency (RF) power supply 714 and matching network 716 for powering a plasma. In some implementations, the plasma energy may be controlled by controlling one or more of a process station pressure, a gas concentration, an RF source power, an RF source frequency, and a plasma power pulse timing. For example, RF power supply 714 and matching network 716 may be operated at any suitable power to form a plasma having a desired composition of radical species. Examples of suitable powers are included above. Likewise, RF power supply 714 may provide RF power of any suitable frequency. In some implementations, RF power supply 714 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some implementations, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some implementations, one or more plasma parameters may be programmatically adjusted based on measurements from such in-situ plasma monitors. For example, an OES sensor may be used in a feedback loop for providing programmatic control of plasma power. It will be appreciated that, in some implementations, other monitors may be used to monitor the plasma and other process characteristics. Such monitors may include, but are not limited to, infrared (IR) monitors, acoustic monitors, and pressure transducers.

In some implementations, instructions for a controller 750 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some implementations, instructions for setting one or more reactor parameters may be included in a recipe phase. For example, a first recipe phase may include instructions for setting a flow rate of an inert and/or a precursor gas (e.g., the silicon-containing precursor), instructions for setting a flow rate of a carrier gas (such as argon), and time delay instructions for the first recipe phase. A second, subsequent recipe phase may include instructions for modulating or stopping a flow rate of an inert and/or a precursor gas, and instructions for modulating a flow rate of a carrier or purge gas and time delay instructions for the second recipe phase. A third recipe phase may include instructions for modulating a flow rate of a nitrogen-containing reactant gas such as ammonia, instructions for modulating the flow rate of a carrier or purge gas, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. The fourth recipe, in some implementations, may include instructions for igniting plasma of the nitrogen-containing reactant. It will be appreciated that these recipe phases may be further subdivided and/or iterated in any suitable way within the scope of the disclosed implementations. In some implementations, the controller 750 may include any of the features described below with respect to system controller 850 of FIG. 8.

Figure 7B:
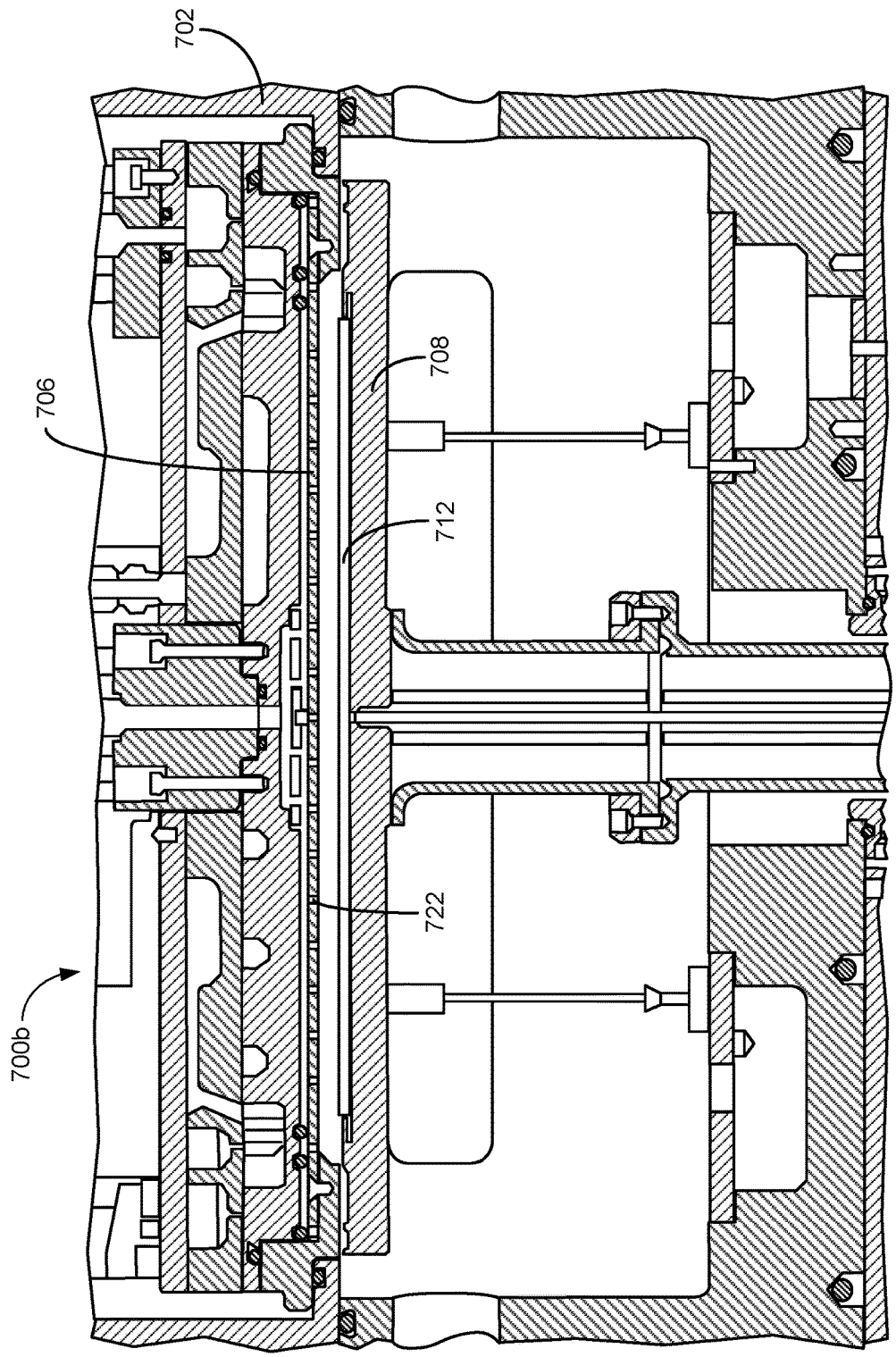
FIG. 7B is a schematic diagram of an example single-station module for depositing a nitride film via PEALD and thermal ALD cycles.

FIG. 7B is a schematic diagram of an example single-station module for depositing a nitride film via PEALD and thermal ALD cycles. Like the apparatus 700a in FIG. 7A, the single-station module 700b can include a showerhead 706 opposite a pedestal 708. The pedestal 708 can support a wafer 712, where the wafer 712 can include a plurality of features (not shown). The pedestal 708 can be heated to an elevated temperature during processing of the wafer 712. The showerhead 706 can include a plurality of through-holes 722 through which process gases can be supplied into a process chamber 702 of the single-station module 700b. The process gases can include the silicon-containing precursor and/or the nitrogen-containing reactant. The single-station module 700b can be capable of performing the mixed mode ALD cycle described above, including one or more PEALD cycles and one or more thermal ALD cycles, to deposit a nitride film on a wafer 712.

As described above, one or more process stations may be included in a multi-station processing tool. FIG. 8 shows a schematic view of an implementation of a multi-station processing tool 800 with load locks 821. The multi-station processing tool 800 includes a transfer module 803. The transfer module 803 provides a clean, pressurized environment to minimize risk of contamination of wafer being processed as they are moved between various modules. Mounted on the transfer module 803 is a multi-station reactor 809 capable of performing ALD, including PEALD and thermal ALD if desired, according to implementations disclosed herein. Multi-station reactor 809 may include multiple stations 811, 813, 815, and 817 that may perform these operations. Some of the stations may include a heated pedestal or wafer support, one or more gas inlets or showerhead or dispersion plate. While the depicted multi-station reactor 809 includes four stations, it will be understood that a reactor according to the present disclosure may have any suitable number of stations. For example, in some implementations, a reactor may have five or more stations, while in other implementations a reactor may have three or fewer stations.

Also mounted on the transfer module 803 may be one or more single or multi-station modules 807 capable of performing plasma or chemical (non-plasma) pre-cleans. The module may also be used for various other treatments. The multi-station processing tool 800 also includes one or more wafer source modules 801, where wafers are stored before and after processing. An atmospheric robot (not shown) in the atmospheric transfer chamber 819 may first remove wafers from the source modules 801 to load locks 821. A wafer transfer device (generally a robot arm unit) in the transfer module 803 moves the wafers from load locks 821 to and among the modules mounted on the transfer module 803.

In some implementations, system controller 850 controls all of the activities of process tool 800. System controller 850 executes system control software stored in mass storage device, loaded into memory device, and executed on processor. Alternatively, the control logic may be hard coded in the controller 850. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software may include instructions for controlling the timing, mixture of gases, gas flow rates, chamber and/or station pressure, chamber and/or station temperature, wafer temperature, target power levels, RF power levels, wafer pedestal, chuck and/or susceptor position, and other parameters of a particular process performed by process tool 800. System control software may be configured in any suitable way. For example, various process tool component subroutines or control objects may be written to control operation of the process tool components used to carry out various process tool processes. System control software may be coded in any suitable computer readable programming language.

In some implementations, system control software may include input/output control (IOC) sequencing instructions for controlling the various parameters described above. Other computer software and/or programs stored on mass storage device and/or memory device associated with system controller 850 may be employed in some implementations. Examples of programs or sections of programs for this purpose include a wafer positioning program, a process gas control program, a pressure control program, a heater control program, and a plasma control program.

A wafer positioning program may include program code for process tool components that are used to load the substrate onto a wafer pedestal and to control the spacing between the wafer and other parts of process tool 800.

A process gas control program may include code for controlling gas composition (e.g., silicon-containing precursor gases, and nitrogen-containing reactant gases, carrier gases and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the wafer. Alternatively, the heater control program may control delivery of a heat transfer gas (such as helium) to the wafer.

A plasma control program may include code for setting RF power levels applied to the process electrodes in one or more process stations in accordance with the implementations herein.

A pressure control program may include code for maintaining the pressure in the process chamber in accordance with the implementations herein.

In some implementations, there may be a user interface associated with system controller 850. The user interface may include a display screen, graphical software displays of the apparatus and/or process conditions, and user input devices such as pointing devices, keyboards, touch screens, microphones, etc.

In some implementations, parameters adjusted by system controller 850 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 850 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various implementations described herein.

The system controller 850 will typically include one or more memory devices and one or more processors configured to execute the instructions so that the apparatus will perform a method in accordance with disclosed implementations. Machine-readable media containing instructions for controlling process operations in accordance with disclosed implementations may be coupled to the system controller 850.

In some implementations, the system controller 850 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 850, depending on the processing conditions and/or the type of system, may be programmed to control any of the processes disclosed herein, including the delivery of processing gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 850 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 850 in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The system controller 850, in some implementations, may be a part of or coupled to a computer that is integrated with, coupled to the system, otherwise networked to the system, or a combination thereof. For example, the system controller 850 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 850 receives instructions in the form of data, which specify parameters for each of the processing steps to be performed during one or more operations. It should be understood that the parameters may be specific to the type of process to be performed and the type of tool that the system controller 850 is configured to interface with or control. Thus as described above, the system controller 850 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 850 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Lithographic Patterning

The apparatuses/processes described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Other Embodiments

Although illustrative embodiments and applications of this invention are shown and described herein, many variations and modifications are possible which remain within the concept, scope, and spirit of the invention, and these variations would become clear to those of ordinary skill in the art after perusal of this application. Accordingly, the present embodiments are to be considered as illustrative and not restrictive, and the invention is not to be limited to the details given herein, but may be modified within the scope and equivalents of the appended claims.

What is claimed is:

1. A method comprising:
applying a plurality of mixed mode atomic layer deposition (ALD) cycles on a wafer, each mixed mode ALD cycle comprising one or more plasma-enhanced atomic layer deposition (PEALD) cycles and one or more thermal atomic layer deposition (thermal ALD) cycles, wherein each PEALD cycle comprises a first dose phase and a plasma exposure phase and each thermal ALD cycle comprises a second dose phase and a thermal conversion phase, each PEALD cycle and each thermal ALD cycle converting a nitrogen-containing reactant into a nitride layer on the wafer.

2. The method of claim 1, wherein applying the plurality of mixed mode ALD cycles comprises:
applying the one or more PEALD cycles, wherein applying the one or more PEALD cycles includes:
introducing a first dose of a silicon-containing precursor in a vapor phase to the wafer;
exposing the wafer to a plasma of the nitrogen-containing reactant; and
converting the nitrogen-containing reactant into a nitride layer on the wafer, wherein the nitride layer is a silicon nitride layer.

3. The method of claim 2, wherein applying the plurality of mixed mode ALD cycles comprises:
applying the one or more thermal ALD cycles, wherein applying the one or more thermal ALD cycles includes:
introducing a second dose of the silicon-containing precursor in a vapor phase to the wafer;
exposing the wafer to the nitrogen-containing reactant at an elevated temperature; and
converting the nitrogen-containing reactant into a nitride layer at the elevated temperature, wherein the nitride layer is a silicon nitride layer.

4. The method of claim 3, wherein the elevated temperature is between about 500° C. and about 630° C.

5. The method of claim 3, wherein the wafer is maintained at the elevated temperature during exposure of the wafer to the plasma of the nitrogen-containing reactant.

6. The method of claim 3, wherein a thermal exposure time of exposing the wafer to the nitrogen-containing precursor at the elevated temperature is greater than a plasma exposure time of exposing the wafer to the plasma of the nitrogen-containing precursor.

7. The method of claim 3, wherein a ratio of silicon to nitrogen concentration in the silicon nitride layer is between 1.2:1 and 1.8:1.

8. The method of claim 3, wherein the silicon nitride layer has a refractive index between about 2.0 and about 2.5.

9. The method of claim 3, wherein the nitrogen-containing reactant includes an amine or ammonia.

10. The method of claim 3, wherein the silicon-containing precursor includes a halogenated silane.

11. The method of claim 1, wherein each mixed mode ALD cycle comprises a plurality of PEALD cycles and a plurality of thermal ALD cycles, wherein a number of the thermal ALD cycles is equal to or greater than a number of the PEALD cycles in each mixed mode ALD cycle.

12. The method of claim 1, wherein the wafer includes a plurality of features, each of the features having a depth to width aspect ratio of greater than 10:1.

13. A method of manufacturing a nitride film on a wafer, the method comprising:
providing a wafer into a process chamber;
applying one or more plasma-enhanced atomic layer deposition (PEALD) cycles to deposit one or more nitride layers on the wafer via plasma conversion of a nitrogen-containing reactant, each PEALD cycle comprising a first dose phase and a plasma exposure phase;
applying, before or after the one or more PEALD cycles, one or more thermal atomic layer deposition (thermal ALD) cycles to deposit one or more nitride layers on the wafer via thermal conversion of the nitrogen-containing reactant, each thermal ALD cycle comprising a second dose phase and a thermal conversion phase; and
forming a nitride film from the one or more nitride layers.

14. The method of claim 13, wherein the one or more PEALD cycles includes a plurality of PEALD cycles and the one or more thermal ALD cycles includes a plurality of thermal ALD cycles, wherein a number of the thermal ALD cycles is equal to or greater than a number of the PEALD cycles.

15. The method of claim 13, wherein a temperature equal to or greater than 500° C. of the wafer is maintained during application of the one or more PEALD cycles and application of the one or more thermal ALD cycles.

16. The method of claim 13, wherein a time of thermal conversion of the nitrogen-containing reactant is greater than a time of plasma conversion of the nitrogen-containing reactant.

17. The method of claim 13, wherein the nitride film is a silicon nitride film.

18. The method of claim 17, wherein the silicon nitride film has a refractive index between about 2.0 and about 2.5.

19. The method of claim 17, where a ratio of silicon to nitrogen concentration in the silicon nitride film is between 1.2:1 and 1.8:1.

20. The method of claim 13, wherein applying the one or more PEALD cycles includes introducing a first dose of a silicon-containing precursor prior to plasma conversion of the nitrogen-containing reactant, and wherein applying the one or more thermal ALD cycles includes introducing a second dose of the silicon-containing precursor prior to thermal conversion of the nitrogen-containing reactant, wherein the silicon-containing precursor includes a halogenated silane, and wherein the nitrogen-containing reactant includes an amine or ammonia.

\* \* \* \* \*